(12) United States Patent
Lee et al.

(10) Patent No.: US 8,940,403 B2
(45) Date of Patent: Jan. 27, 2015

(54) ALLOY WIRE AND METHODS FOR MANUFACTURING THE SAME

(75) Inventors: Jun-Der Lee, Taichung (TW);
Hsing-Hua Tsai, Taichung (TW);
Tung-Han Chuang, Taichung (TW)

(73) Assignee: Wire Technology Co., Ltd., Taichung (TW)

( * ) Notice: Subject to any disclaimer, the term of this patent is extended or adjusted under 35 U.S.C. 154(b) by 310 days.

(21) Appl. No.: 13/495,800

(22) Filed: Jun. 13, 2012

(65) Prior Publication Data
US 2013/0171470 A1    Jul. 4, 2013

(30) Foreign Application Priority Data

Jan. 2, 2012    (TW) .............................. 101100014 A

(51) Int. Cl.
| | | |
|---|---|---|
| B32B 15/02 | (2006.01) | |
| B32B 15/01 | (2006.01) | |
| C22F 1/14 | (2006.01) | |
| C22C 5/06 | (2006.01) | |
| H01L 23/00 | (2006.01) | |

(52) U.S. Cl.
CPC .............. *B32B 15/018* (2013.01); *H01L 24/45* (2013.01); *C22C 5/06* (2013.01); *C22F 1/14* (2013.01); *H01L 24/43* (2013.01)
USPC ........... 428/606; 428/607; 428/673; 428/672; 428/670; 148/430; 148/537; 148/678; 420/505

(58) Field of Classification Search
None
See application file for complete search history.

(56) References Cited

U.S. PATENT DOCUMENTS

| | | | |
|---|---|---|---|
| 4,986,856 A | 1/1991 | Tanigawa et al. | |
| 6,178,623 B1 | 1/2001 | Kitazawa et al. | |
| 7,645,522 B2 | 1/2010 | Bischoff et al. | |
| 8,101,030 B2 * | 1/2012 | Lee ............................... | 148/522 |
| 8,101,123 B2 * | 1/2012 | Lee ............................... | 420/505 |
| 2003/0173659 A1 | 9/2003 | Lee et al. | |
| 2006/0186544 A1 | 8/2006 | Won et al. | |
| 2009/0191088 A1 * | 7/2009 | Lee ............................... | 420/505 |
| 2009/0297391 A1 * | 12/2009 | Lee ............................... | 420/503 |
| 2010/0239455 A1 * | 9/2010 | Lee ............................... | 420/505 |
| 2010/0239456 A1 * | 9/2010 | Lee ............................... | 420/505 |
| 2011/0041964 A1 * | 2/2011 | Schuh et al. .................. | 148/559 |
| 2013/0160902 A1 * | 6/2013 | Lee ............................... | 148/557 |
| 2013/0164169 A1 * | 6/2013 | Lee ............................... | 420/505 |

FOREIGN PATENT DOCUMENTS

JP          2010-167490        *  8/2010

OTHER PUBLICATIONS

Cahn, R.W., Physical Metallurgy, second ed., North Holland Publishing Company, Amsterdam, 1970, p. 1184.

(Continued)

*Primary Examiner* — John J Zimmerman
(74) *Attorney, Agent, or Firm* — Birch, Stewart, Kolasch & Birch, LLP

(57) ABSTRACT

An alloy wire made of a material selected from one of a group consisting of a silver-gold alloy, a silver-palladium alloy and a silver-gold-palladium alloy is provided. The alloy wire is with a polycrystalline structure of a face-centered cubic lattice and includes a plurality of grains. A central part of the alloy wire includes slender grains or equi-axial grains, and the other parts of the alloy wire consist of equi-axial grains. A quantity of the grains having annealing twins was 20 percent or more of the total quantity of the grains of the alloy wire.

19 Claims, 20 Drawing Sheets

(56) References Cited

OTHER PUBLICATIONS

Chen, K. C. et al., "Observation of Atomic Diffusion at Twin-Modified Grain Boundaries in Copper", Science 321 (2008), pp. 1066-1069, Aug. 2008.

Dillamore, I.L. et al., "A determination of the stacking-fault energy of some pure F.C.C. metals", Philosophical Magazine 9 (1964), pp. 517-526.

Johari, O. et al., "Substructures in Explosively Deformed Cu and Cu-Al Alloys", Acta Metallurgica, vol. 12, (Oct. 1964), pp. 1153-1159.

Lee, S.Y. et al., "Effect of thermomechanical processing on grain boundary characteristics in two-phase brass", Materials Science and Engineering A 363 (2003), pp. 307-315.

Li, Q. et al., "On the calculation of annealing twin density", Science Direct, Scripta Materialia 55 (2006), pp. 1155-1158, Sep. 2006.

Lin, P. et al., "Experimental Assessment of the Contribution of Annealing Twins to CSL Distributions in FCC Materials", Scripta Materialia, vol. 36, No. 10 (1997), pp. 1145-1149.

Lu, L. et al., "Revealing the Maximum Strength in Nanotwinned Copper", Science vol. 323 (Jan. 30, 2009), pp. 607-610.

Lu, Lu et al., "Ultrahigh Strength and High Electrical Conductivity in Copper", Science 304 (2004), pp. 422-426, Apr. 2004.

Mandal, S. et al., "Studies on twinning and grain boundary character distribution during anomalous grain growth in a Ti-modified austenitic stainless steel", Materials Science and Engineering A 515 (2009), pp. 134-140.

Meyer, R. et al., "Stacking-fault energies for Ag, Cu, and Ni from empirical tight-binding potentials", Phys. Rev. B 66 (2002), pp. 1-5, Jul. 2002.

Pande, C.S., "Effect of annealing twins on Hall-Petch relation in polycrystalline materials", Matererials Science and Engineering A 367 (2004), pp. 171-175.

Randle, V., "Sigma-Boundary Statistics by Length and Number", Interface Science 10 (2002), pp. 271-277.

Souai, N. et al., "About the possibility of grain boundary engineering via hot-working in a nickel-base superalloy", Science Direct, Scripta Materialia 62 (2010), pp. 851-854, Feb. 2010.

Xia, S. et al., "Effects of strain and annealing processes on the distribution of $\Sigma 3$ boundaries in a Ni-based superalloy", Science Direct, Scripta Materialia 54 (2006), pp. 2019-2022, Apr. 2006.

\* cited by examiner

ALLOY WIRE AND METHODS FOR MANUFACTURING THE SAME

CROSS REFERENCE TO RELATED APPLICATIONS

This Application claims priority of Taiwan Patent Application No. 101100014, filed on Jan. 2, 2012, the entirety of which is incorporated by reference herein.

BACKGROUND OF THE INVENTION

1. Field of the Invention

The invention relates to alloy wires and manufacturing methods thereof, and more specifically to alloy wires utilized for wire bonding of packages of electronic devices and manufacturing methods thereof.

2. Description of the Related Art

Wire bonding is an extremely important step in the packaging processes of semiconductor devices and light emitting diodes (LED). Bonding wires provide not only signal transmission and power transmission between chips and chip carriers (substrates), but also heat dissipation performance. Therefore, it is necessary for metal wires for wire bonding to have not only excellent electrical conductivity and thermal conductivity, but also sufficient strength and ductility. The hardness of the metal wires cannot be too high in order to prevent chips from cracking during hot pressing in the wire bonding step and have a good contact between the metal wires and the bond pads to have excellent bondability. Further, it is necessary for the metal wires to have well antioxidative activity and corrosion resistance because the polymer encapsulants for packaging commonly have corrosive chloride ions and hygroscopic property absorbing moisture from the environment. Moreover, the metal wire conducts a high volume of heat to the first bond (ball bond) when the ball bond cools from the molten state to room temperature, and thus, a heat affected zone is formed in the metal wire near the ball bond. Grain growth happens to the metal wire in the heat affected zone due to heat build-up, resulting in formation of local coarse grains. The local coarse grains provide a lower strength, and thus, the metal wire cracks in the heat affected zone during the wire pull test, negatively affecting the bonding strength. When completing the packaging processes of the semiconductor devices or the light emitting diodes, the high current density through the metal wires potentially activate atoms in the metal wires and thus generate electron migration during utilization of the packaged products. As a result, holes are formed at the terminal of the metal wires, resulting in a decrease in electrical conductivity and thermal conductivity, and even the occurrence of broken wires.

The bonding wires utilized in the present electronic industry are mainly pure gold and pure aluminum. Recently, pure copper wires (referring to US20060186544A1 and U.S. Pat. No. 4,986,856) and composite metal wires such as copper wires with gold plating (referring to U.S. Pat. No. 7,645, 522B2), copper wires with palladium plating (referring to US 20030173659A1), copper wires with platinum plating (referring to US 20030173659A1) and aluminum wires with copper plating (referring to U.S. Pat. No. 6,178,623B1) are also being utilized for the bonding wires. The internal structures of the conventional metal wires for wire bonding are all equi-axial fine grains. The conventional fine grain structure may provide sufficient tensile strength and ductility. However, there are a lot of high angle grain boundaries existing between the fine grains. The high angle grain boundaries scatter the electron transmission, and thus increase the electrical resistivity of the metal wires and simultaneously decrease the thermal conductivity of the metal wires. On the other hand, the high angle grain boundaries have higher interfacial energy and provide favorable paths for environmental oxidation, sulfuration and chloride ion corrosion, lowering the reliability of packaged electronic products. Moreover, the heat affected zone tends to be formed in the metal wire with a fine grain structure near the first bond (ball bond) during wire bonding. Thus, the wire bonding strength is decreased, and electron migration tends to occur to the metal wire with a fine grain structure during utilization of packaged semiconductor devices or light emitting diodes, which are all main factors causing the deterioration of quality and reliability of conventional packaged products utilizing wire bonding technology.

Thus, alloy wires and manufacturing methods thereof are required to solve the described problems.

BRIEF SUMMARY OF THE INVENTION

An embodiment of the invention provides an alloy wire made of a material selected from one of a group consisting of a silver-gold alloy, a silver-palladium alloy and a silver-gold-palladium alloy. The alloy wire is with a polycrystalline structure of a face-centered phase and comprises a plurality of grains. A central part of the alloy wire comprises slender grains or equi-axial grains, and the other parts of the alloy wire consist of equi-axial grains. A quantity of the grains comprising annealing twins was 20 percent or more of the total quantity of the grains of the alloy wire.

In the alloy wire, it is preferred that the silver-gold alloy comprises 0.01 to 30.00 weight percent of gold and a balance of silver, the silver-palladium alloy comprises 0.01 to 10.00 weight percent of palladium and a balance of silver, and the silver-gold-palladium alloy comprises 0.01 to 30.00 weight percent of gold, 0.01 to 10.00 weight percent of palladium and a balance of silver.

A wire diameter of the alloy wire is preferably between 10 μm and 50 μm.

An embodiment of the invention provides an alloy wire comprising a base wire and one or more layers of a metal coating. The base wire is made of a material selected from one of a group consisting of a silver-gold alloy, a silver-palladium alloy and a silver-gold-palladium alloy. The base wire is with a polycrystalline structure of a face-centered phase and comprises a plurality of grains. A central part of the base wire comprises slender grains or equi-axial grains, and the other parts of the base wire consist of equi-axial grains. A quantity of the grains comprising annealing twins was 20 percent or more of the total quantity of the grains of the base wire. One or more layers of the metal coating are plated overlying the base wire. The metal coating is made of a material selected from one of a group consisting of substantially pure gold, substantially pure palladium and a gold-palladium alloy.

In the alloy wire, it is preferred that the silver-gold alloy comprises 0.01 to 30.00 weight percent of gold and a balance of silver, the silver-palladium alloy comprises 0.01 to 10.00 weight percent of palladium and a balance of silver, and the silver-gold-palladium alloy comprises 0.01 to 30.00 weight percent of gold, 0.01 to 10.00 weight percent of palladium and a balance of silver.

A wire diameter of the alloy wire is preferably between 10 μm and 50 μm. The metal coating is preferably between 0.1 μm and 5 μm thick.

An embodiment of the invention provides a manufacturing method of an alloy wire. First, a thick wire made of a material selected from one of a group consisting of a silver-gold alloy, a silver-palladium alloy and a silver-gold-palladium alloy is provided. Then, a wire diameter of the thick wire is step-by-step decreased to form a fine wire with a wire diameter less than that of the thick wire utilizing N steps of cold work shaping steps. In each of the (N−1)th and Nth steps of the cold work shaping steps, the deformation is between 1% and 15% compared to an in-process wire from its immediately preceding cold work shaping step, wherein N is a positive integer equal to 3 or greater. N steps of annealing steps are performed on the in-process wire respectively between each of the cold work shaping steps and after the Nth step of the cold work shaping steps. The (N−1)th step of the annealing steps between the (N−1)th and Nth steps of the cold work shaping steps is performed at an annealing temperature of between 0.5 Tm and 0.7 Tm during an annealing period of between 1 second and 10 seconds, wherein Tm is a melting point in the Kelvin temperature scale of the material of the thick wire. The Nth step of the annealing steps after the Nth step of the cold work shaping steps is performed at an annealing temperature of between 20K and 100K higher than that of the (N−1)th step of the annealing steps during an annealing period of between 2 seconds and 60 seconds, resulting in the fine wire being with a polycrystalline structure of a face-centered phase and comprising a plurality of grains, and forming annealing twins in at least some of the grains. A central part of the fine wire comprises slender grains or equi-axial grains, and the other parts of the fine wire consist of equi-axial grains. A quantity of the grains comprising the annealing twins is 20 percent or more of the total quantity of the grains of the fine wire.

In the manufacturing method of the alloy wire, the cold work shaping steps are preferably wire drawing steps, extrusion steps or a combination thereof.

In the manufacturing method of the alloy wire, the provision of the thick wire may comprise steps of melting raw materials of the material of the thick wire, followed by casting to form an ingot, and performing cold work on the ingot to complete the thick wire. The provision of the thick wire may alternatively comprise steps of melting raw materials of the material of the thick wire, followed by a process of continuous casting to form the thick wire.

In the manufacturing method of the alloy wire, the method preferably further comprises plating a metal coating overlying a surface of the thick wire utilizing electrical plating, evaporation or sputtering prior to the cold work shaping steps. The metal coating is preferably made of a material selected from one of a group consisting of substantially pure gold, substantially pure palladium and a gold-palladium alloy. The metal coating is preferably between 0.1 µm and 10 µm thick.

In the manufacturing method of the alloy wire, the method preferably further comprises plating a metal coating overlying a surface of the thick wire utilizing electrical plating, evaporation or sputtering after the Nth step of the cold work shaping steps. The metal coating is preferably made of a material selected from one of a group consisting of substantially pure gold, substantially pure palladium and a gold-palladium alloy. The metal coating is preferably between 0.1 µm and 5 µm thick.

In the manufacturing method of the alloy wire, it is preferred that the silver-gold alloy comprises 0.01 to 30.00 weight percent of gold and a balance of silver, the silver-palladium alloy comprises 0.01 to 10.00 weight percent of palladium and a balance of silver, and the silver-gold-palladium alloy comprises 0.01 to 30.00 weight percent of gold, 0.01 to 10.00 weight percent of palladium and a balance of silver.

In the manufacturing method of the alloy wire, a wire diameter of the thick wire is preferably between 5 mm and 10 mm, and a wire diameter of the fine wire is preferably between 10 µm and 50 µm.

Further scope of the applicability of the invention will become apparent from the detailed descriptions given hereinafter. It should be understood however, that the detailed descriptions and specific examples, while indicating preferred embodiments of the invention, are given by way of illustration only, as various changes and modifications within the spirit and scope of the invention will become apparent to those skilled in the Art from the detailed descriptions.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 1B is a lengthwise cross-section of the alloy wire shown in FIG. 1A along a direction parallel to the longitudinal direction of the alloy wire shown in FIG. 1A, and FIG. 1C is a transverse cross-section of the alloy wire shown in FIG. 1A along a direction perpendicular to the longitudinal direction of the alloy wire shown in FIG. 1A;

FIG. 2B is a lengthwise cross-section of the alloy wire shown in FIG. 2A along a direction parallel to the longitudinal direction of the alloy wire shown in FIG. 2A, and FIG. 2C is a transverse cross-section of the alloy wire shown in FIG. 2A along a direction perpendicular to the longitudinal direction of the alloy wire shown in FIG. 2A;

FIGS. 12A and 12B are X-ray diffraction charts, wherein FIG. 12A shows the X-ray diffraction chart of the alloy wire of an example of the invention, and FIG. 12B shows the X-ray diffraction chart of a conventional wire;

DETAILED DESCRIPTION OF THE INVENTION

Figure 1A:
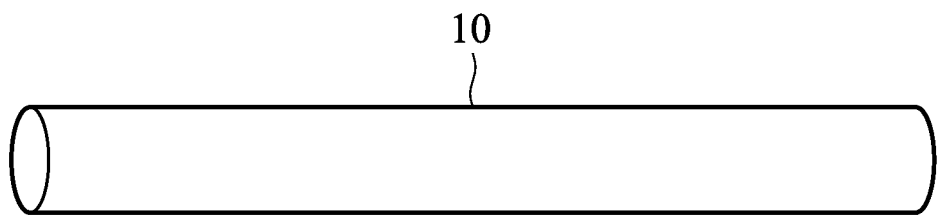
FIGS. 1A, 1B and 1C show an alloy wire of a first embodiment of the invention, wherein FIG. 1A schematically shows a segment of the alloy wire of the first embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

Note that the concepts and specific practice modes of the invention is described in detail by the embodiments and the attached drawings. In the drawings or description, similar elements are indicated by similar reference numerals and/or letters. Further, the element shape or thickness in the drawings can be expanded for simplification or convenience of indication. Moreover, elements which are not shown or described can be in every form known by those skilled in the art.

It is understood that the following disclosure provides many different embodiments, or examples, for implementing different features of the invention. Specific examples of components and arrangements are described below to simplify the present disclosure. These are, Note that merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples.

In the subsequent description, phrases such as "substantially pure gold", "substantially pure palladium" and etc. . . . mean expected to be pure gold, pure palladium and etc. without any impurities in design, as in practice, it is difficult to be mathematically or theoretically pure gold, pure palladium and etc. due to limits of the practical smelting, refining and film coating processes that it is less possible to completely remove impurities from the raw materials. Additionally, when deviation is in an acceptable range of a corresponding standard or specification, it is also recognized to be pure gold, pure palladium and etc. Those skilled in the art are expected to acknowledge, that different standards or specifications, depend upon various properties and conditions, and thus, cannot be specifically listed.

Specific embodiments of the invention for alloy wires and manufacturing methods thereof are described. It is noted that the concepts of the invention can be applied to any known or newly developed alloy wires and manufacturing methods thereof.

Figure 1B:
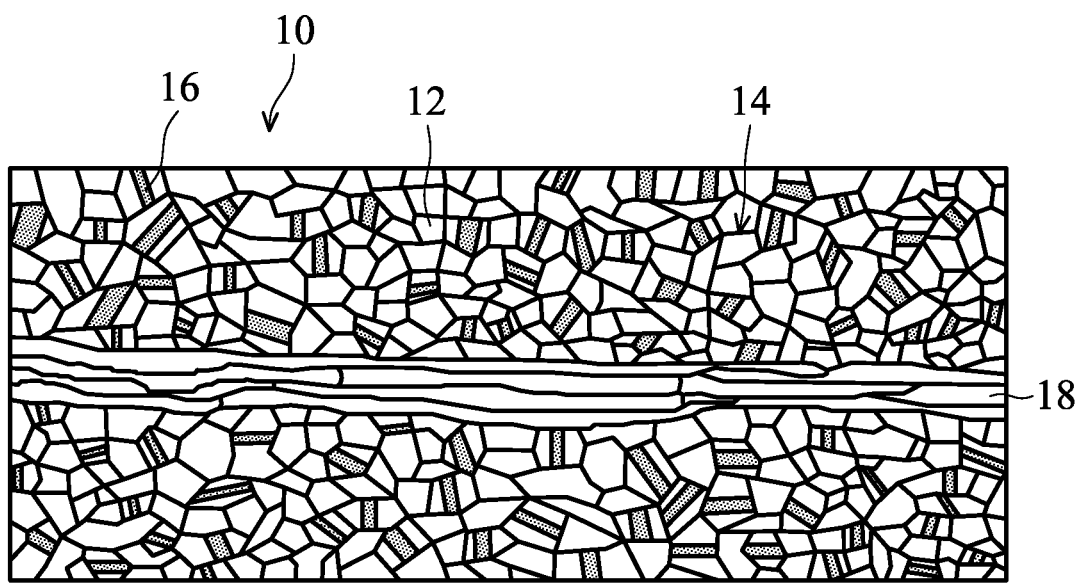
Figure 1C:
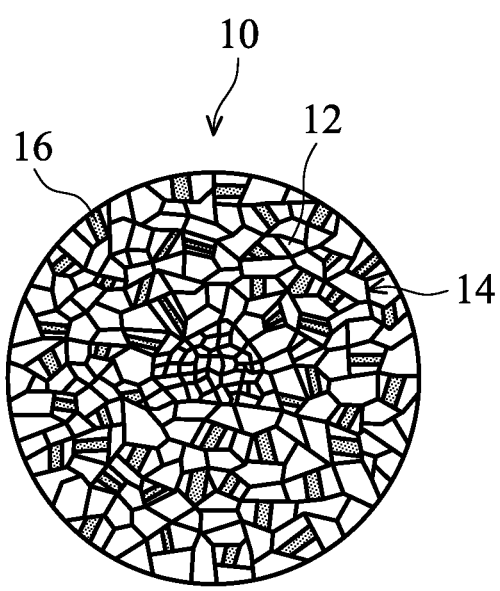

Referring to FIGS. 1A, 1B and 1C showing an alloy wire 10 of a first embodiment of the invention, FIG. 1A schematically shows a segment of the alloy wire 10, FIG. 1B is a lengthwise cross-section of the alloy wire 10 shown in FIG. 1A along a direction parallel to the longitudinal direction of the alloy wire 10 shown in FIG. 1A, and FIG. 1C is a transverse cross-section of the alloy wire 10 shown in FIG. 1A along a direction perpendicular to the longitudinal direction of the alloy wire 10 shown in FIG. 1A.

As shown in FIG. 1A, the alloy wire 10 of the first embodiment of the invention is made of a material selected from one of a group consisting of a silver-gold alloy, a silver-palladium alloy and a silver-gold-palladium alloy. As shown in FIG. 1B, the lengthwise cross-section of the alloy wire 10 shows a polycrystalline structure of a face-centered phase and the alloy wire 10 comprising a plurality of grains. Most of the grains are equi-axial grains 12. High angle grain boundaries 14 are between every equi-axial grain 12. A quantity of the grains comprising annealing twins 16 is 20 percent or more of the total quantity of the grains of the alloy wire 10. In addition to the described equi-axial grains 12, some slender grains 18 may exist in a central part of the alloy wire 10.

The "central part of the alloy wire" described in the whole specification means the alloy wire part in a region extending along the radial direction of the alloy wire from an axis of the alloy wire to positions having a distance of 30 percent of the alloy wire radius from the axis. The "central part of the alloy wire" may be completely composed of a plurality of slender grains 18 or equi-axial grains 12, or in alternative comprise both equi-axial grains 12 and slender grains 18. Other parts of the alloy wire beyond the "central part of the alloy wire" consist of a plurality of equi-axial grains 12.

Figure 2A:
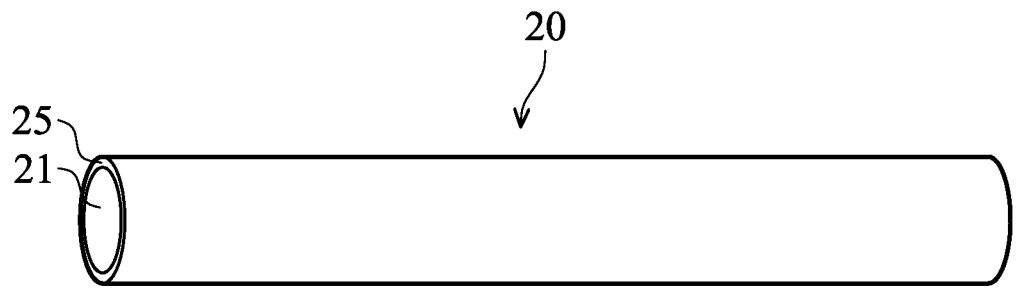
FIGS. 2A, 2B and 2C show an alloy wire of a second embodiment of the invention, wherein FIG. 2A schematically shows a segment of the alloy wire of the second embodiment of the invention.
Figure 2B:
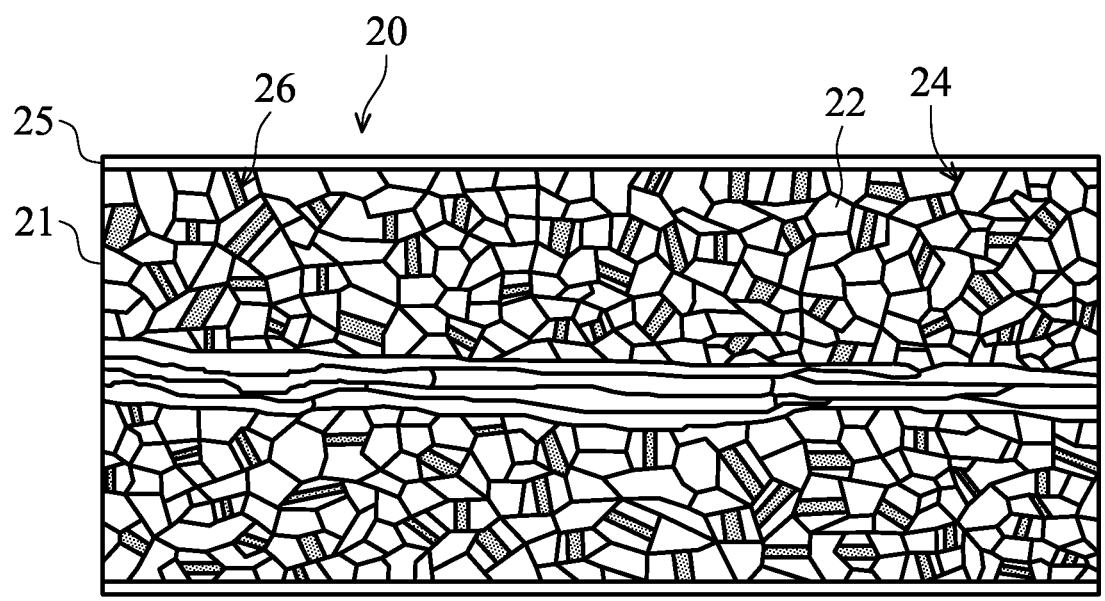
Figure 2C:
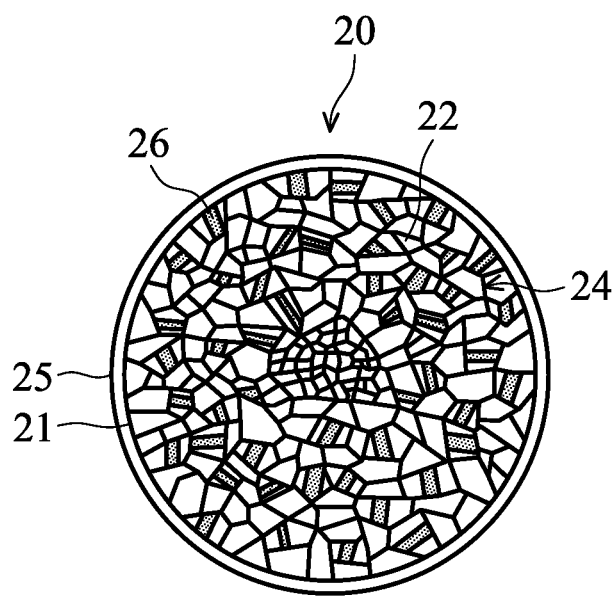

Next, referring to FIGS. 2A, 2B and 2C showing an alloy wire 20 of a second embodiment of the invention, FIG. 2A schematically shows a segment of the alloy wire 20 of the second embodiment of the invention, FIG. 2B is a lengthwise cross-section of the alloy wire 20 shown in FIG. 2A along a direction parallel to the longitudinal direction of the alloy wire 20 shown in FIG. 2A, and FIG. 2C is a transverse cross-section of the alloy wire 20 shown in FIG. 2A along a direction perpendicular to the longitudinal direction of the alloy wire 20 shown in FIG. 2A.

A second embodiment of the invention provides an alloy wire 20 comprising a base wire 21 and a metal coating 25. The base wire 21 is made of a material selected from one of a group consisting of a silver-gold alloy, a silver-palladium alloy and a silver-gold-palladium alloy. The base wire 21 is with a polycrystalline structure of a face-centered phase and comprises a plurality of grains, wherein most of the grains are equi-axial grains 22. High angle grain boundaries 24 are between every equi-axial grain 22. A quantity of the grains comprising annealing twins 26 is 20 percent or more of the total quantity of the grains of the base wire 21. In addition to the described equi-axial grains 22, some slender grains 28 may exist in a central part of the alloy wire 20, such that the central part of the alloy wire 20 may comprises slender grains 28, equi-axial grains 22 or a combination thereof. The metal coating 25 is plated overlying the base wire 21. The metal 25 may be composed one single layer or a plurality of layers of metal films. The metal coating 25 is made of a material selected from one of a group consisting of substantially pure gold, substantially pure palladium and a gold-palladium alloy. The base wire 21 covered by the metal coating 25 can be protected from corrosion due to chemical inertness of the material of the metal coating 25. The metal coating 25 can also be utilized as a lubricant during wire drawing steps. Moreover, the metal coating 25 is preferably between 0.1 μm and 5.0 μm thick. The grain structure of the metal coating 25 is not shown in FIGS. 2B and 2C.

The silver-gold alloy, silver-palladium alloy and silver-gold-palladium alloy described in the whole specification mean alloys containing silver as a main composition with added gold and/or palladium thereto, wherein the contents of gold and palladium are not greater than the content of silver acted as the main composition.

Further, wire diameters of the alloy wires 10 and 20 of the first and second embodiments of the invention are preferably between 10 μm and 50 μm, which are suitable for wires utilized in wire bonding for packages of electronic devices. Note that a user can also apply the inventive alloy wires to other technical fields and purposes, such as audio wires, signal or power transmission wires, voltage transformer wires and etc. as desired. The wire diameter of the inventive alloy wires may also be modified as desired, and is not limited in the described exemplary range.

One of the characteristics of the alloy wire of the invention is that the alloy wire is with a polycrystalline structure and comprises a plurality of grains. The central part of the alloy wire comprises slender grains, and the other parts of the alloy wire consist of equi-axial grains. An average diameter of the grains is between 1 μm and 10 μm, slightly greater than the average diameter of conventional wire for wire-bonding which is between 0.5 μm and 1 μm. As a result, the density of the high angle grain boundaries of the inventive alloy wire is deceased, decreasing drawbacks caused by the plenty of high angle grain boundaries between fine grains described above. A more important characteristic of the alloy wire of the invention is that at least 20 percent of the grains of the inventive alloy wire comprise am annealing twin structure therein. The twin boundaries of the annealing twin structure are coherent crystal structures belonging to Σ3 special grain boundaries with low energy. The interfacial energy of the twin boundaries is only 5 percent of that of common high angle grain boundaries (referring to George E. Dieter, Mechanical Metallurgy, McGRAW-HILL Book Company, 1976, P. 135-141). The lower interfacial energy of the twin boundaries prevents the twin boundaries from being paths for oxidation, sulfuration and chloride ion corrosion and thus provides better antioxidative activity and better corrosion resistance. Further, the symmetrical lattice arrangement of the annealing twins provides little scattering for electron transmission, and thus provides better electrical conductivity and thermal conductivity. Such effect was proved in a pulsed electrodeposited copper foils (referring to L. Lu, Y. Shen, X. Chen, L. Qian, and K. Lu, Ultrahigh Strength and High Electrical Conductivity in Copper, Science, vol. 304, 2004, p. 422-426). The twin boundaries of the low-energy twin structure are more stable than the common high angle grain boundaries due to lower interfacial energy. At high temperatures, not only is it not easy to move the twin boundaries, but also the twin boundaries provide anchor effect for the high angle grain boundaries around the grains. As a result, the high angle grain boundaries also cannot move, and no apparent grain growth occurs in the whole grain structure. Even when the first bond (ball bond) cools from the molten state to room temperature during wire bonding, the original grain size of the inventive alloy wire is still able to be kept, preventing the heat affected zone from formation due to fast grain growth resulted from solidification heat of the ball bond built up in the conventional fine grain structure metal wire near the ball bond, and preventing decrease of strength resulting from the wire pull test. On the other hand, diffusion rate of atoms from or cross the twin boundaries is extremely low, and the occurrence of the internal atom movement in the alloy wire introduced by high current density is quite difficult during utilization of the electronic products. Thus, the electron migration problem occurring in the conventional metal wires for wire bonding as described is solved. There is a publication proving that the twins can suppress the electron migration of the material in copper thin films (referring to K. C. Chen, W. W. Wu, C. N. Liao, L. J. Chen, and K. N. Tu, Observation of Atomic Diffusion at Twin-Modified Grain Boundaries in Copper, Science, vol. 321, 2008, p. 1066-1069.). To sum up, the alloy wire of the invention provides better quality and reliability than those of the conventional metal wires when utilizing the alloy wire of the invention as a wire for wire bonding in products of semiconductor devices and light emitting diodes.

Further, it is necessary that at least 20 percent of the grains of the inventive alloy wire comprise an annealing twin structure therein to make the effects apparent. In the conventional metal wires for wire bonding, the annealing twin structure may be found on rare occasions. However, the quantity of grains comprising the annealing twin structure is 10 percent or less of the total grains of the conventional wire. Thus, the conventional metal wires cannot provide the aforementioned effects provided by the alloy wire of the invention.

In more detailed, although the grain size of the alloy wire of the invention is slightly greater than the grain size of the conventional metal wires, the movement of dislocations can also be blocked to strengthen the material due to many of the grains in the alloy wire of the invention comprising annealing twins with different crystal orientations from that of the grains where the annealing twins are. The strengthening mechanism is different from that of the conventional metal wires with fine grain structures requiring high angle grain boundaries to block the movement of the dislocations but introducing problems negatively affecting the wire bond quality and reliability. Thus, the alloy wire for wire bonding comprising annealing twin structures may have a tensile strength similar to or higher than that of the conventional metal wires comprising fine grain structures. However, the ductility of the alloy wire of the invention is higher than that of conventional metal wires because the dislocations can accumulate at the twin boundaries. Thus, the mechanical properties of the alloy wire of the invention are better than those of the conventional metal wires.

According to mechanisms of Physical Metallurgy (referring to George E. Dieter, Mechanical Metallurgy, McGRAW-HILL Book Company, 1976, P. 135-141. 及 R. W. Cahn, Physical Metallurgy, 1970, P. 1184-1185), strain energy is built-up in the material during cold work, and atoms in some regions in a grain are driven by the strain energy and thus uniformly shear to lattice locations forming mirror symmetry with the atoms which do not shear in the grain where the atoms are. As a result, the annealing twins are formed, and the symmetrical interfaces thereof are twin boundaries. The annealing twins mainly occur in materials with face centered cubic (FCC) lattices which are the densest in crystal lattice arrangement. The twin boundaries are Σ3 special boundaries with low energy, and the crystal orientations thereof are all {111} planes. Compared to the high angle grain boundaries formed by common recrystallization due to annealing, the interfacial energy of the twin boundaries is only 5 percent of that of the high angle grain boundaries. In addition to the FCC lattice structure, generally it is easier to form the annealing twins in materials with less stacking fault energy. The stacking fault energies of gold, silver, palladium, silver-gold alloys, silver-palladium alloys and silver-gold-palladium alloys utilized in the alloy wire of the invention are all less than 100 erg/cm$^2$, and thus, it is easy to form the annealing twins. Although aluminum is a material with an FCC lattice structure, it is extremely less possible to form annealing twins in aluminum because the stacking fault energy of aluminum is approximately 200 erg/cm$^2$. As a result, aluminum does not match the conditions of the alloy wire of the invention.

The alloy wire of the invention is made of a material selected from one of a group consisting of a silver-gold alloy, a silver-palladium alloy and a silver-gold-palladium alloy. The stacking fault energies of the silver-gold alloy, the silver-palladium alloy and the silver-gold-palladium alloy are all less than 100 erg/cm$^2$, independent from the silver content, gold content and palladium content therein. It is preferred that the silver-gold alloy comprises 0.01 to 30.00 weight percent of gold and a balance of silver, the silver-palladium alloy comprises 0.01 to 10.00 weight percent of palladium and a balance of silver, and the silver-gold-palladium alloy comprises 0.01 to 30.00 weight percent of gold, 0.01 to 10.00 weight percent of palladium and a balance of silver when considering other factors such as raw material cost, availability, segregation during cast, formability during wire drawing, resistance to oxidation, tensile strength, hardness, ductility, ball bond quality in wire bonding, bonding strength and etc.

Further, cold work deformation before the annealing treatment is also a critical condition. Strain energy built up by sufficient cold work deformation can drive atoms to form annealing twins. However, if the cold work deformation is too much, nuclei of recrystallized grains will be induced early in the primary recrystallization stage of the annealing treatment. Thus, a lot of fine grains are formed, and it is less possible to form annealing twins. On the contrary, a structure of conventional metal wires is formed. The fine grains provide well tensile strength and ductility. However, the plenty of high angle grain boundaries in the conventional metal wires scatter the electron flow and heat transfer, and also decrease antioxidative activity and corrosion resistance of the metal wires. During ball forming of the first bond of wire bonding, the fine grains having a lot of high angle grain boundaries become coarse grains during fast grain growth due to receiving high heat energy from the solidification heat of the melted free air ball (FAB). As a result, the heat affected zone problem, the most terrible problem during wire bonding, is induced. The strength in the wire pull test is decreased. Subsequently, electron migration is often introduced due to atom transmission in the material of the metal wire caused by current when the electronic products are electrified and work. These factors extremely negatively affect the reliability of packaged products of semiconductor devices and light emitting diodes.

Figure 3:
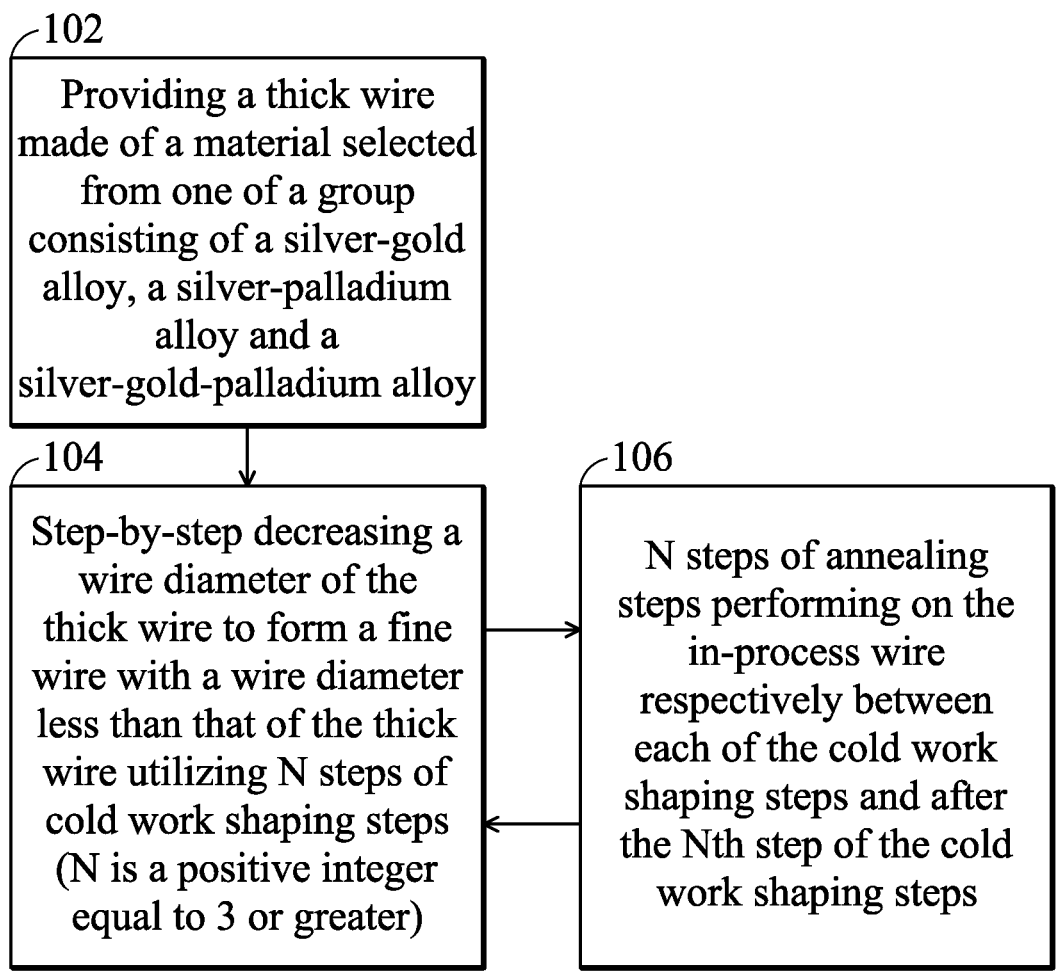
FIG. 3 is a flow chart showing an example of a manufacturing method of the alloy wire of the first embodiment of the invention.

Thus, referring to the flow chart shown in FIG. 3, an example of the manufacturing method of the alloy wire of the first embodiment of the invention may comprise the subsequent steps 102, 104 and 106.

In the step 102, a thick wire made of a material selected from one of a group consisting of a silver-gold alloy, a silver-palladium alloy and a silver-gold-palladium alloy is provided.

In the step 104, a wire diameter of the thick wire is step-by-step decreased to form a fine wire with a wire diameter less than that of the thick wire utilizing N steps of cold work shaping steps. In each of the (N−1)th and Nth steps of the cold work shaping steps, the deformation is between 1% and 15% compared to an in-process wire from its immediately preceding cold work shaping step, wherein N is a positive integer equal to 3 or greater.

In the step 106, N steps of annealing steps are performed on the in-process wire respectively between each of the cold work shaping steps and after the Nth step of the cold work shaping steps. The (N−1)th step of the annealing steps between the (N−1)th and Nth steps of the cold work shaping steps is performed at an annealing temperature of between 0.5 Tm and 0.7 Tm during an annealing period of between 1 second and 10 seconds, wherein Tm is a melting point in the Kelvin temperature scale of the material of the thick wire. The Nth step of the annealing steps after the Nth step of the cold work shaping steps is performed at an annealing temperature of between 20K and 100K higher than that of the (N−1)th step of the annealing steps during an annealing period of between 2 seconds and 60 seconds.

The steps 102, 104 and 106 result in the fine wire being with a polycrystalline structure of a face-centered phase and comprising a plurality of grains, and forming annealing twins in at least some of the grains. A central part of the fine wire comprises slender grains or equi-axial grains, and the other parts of the fine wire consist of equi-axial grains. A quantity of the grains comprising the annealing twins is 20 percent or more of the total quantity of the grains of the fine wire.

Further, in the N steps of annealing steps described in step 106, an annealing apparatus the same as utilized for manufacturing conventional metal wires may be utilized. The step quantity and the annealing conditions of the other annealing steps before the (N−1)th annealing step can be properly determined according to requirements, apparatus conditions and/or other factors while the condition that "N is a positive integer equal to 3 or greater" is not violated. Thus, only the characteristic annealing conditions of the invention is described, and details regarding annealing apparatuses, annealing steps, and step quantity and annealing conditions of other annealing steps are abbreviated.

In the described steps, a wire diameter of the thick wire is preferably between 5 mm and 10 mm, and a wire diameter of the fine wire is preferably between 10 μm and 50 μm. Thus, the alloy wire of the invention can be utilized for a wire for wire bonding.

In the described steps, the melting point Tm of silver-gold alloy, the silver-palladium alloy and the silver-gold-palladium alloy acting as the material of the thick wire is a temperature for the beginning of liquefying in the Kelvin temperature scale of the corresponding composition in the related equilibrium phase diagram.

In the described steps, the "deformation" means the reduction rate of the cross-sectional area of a material during cold work.

Figure 4:
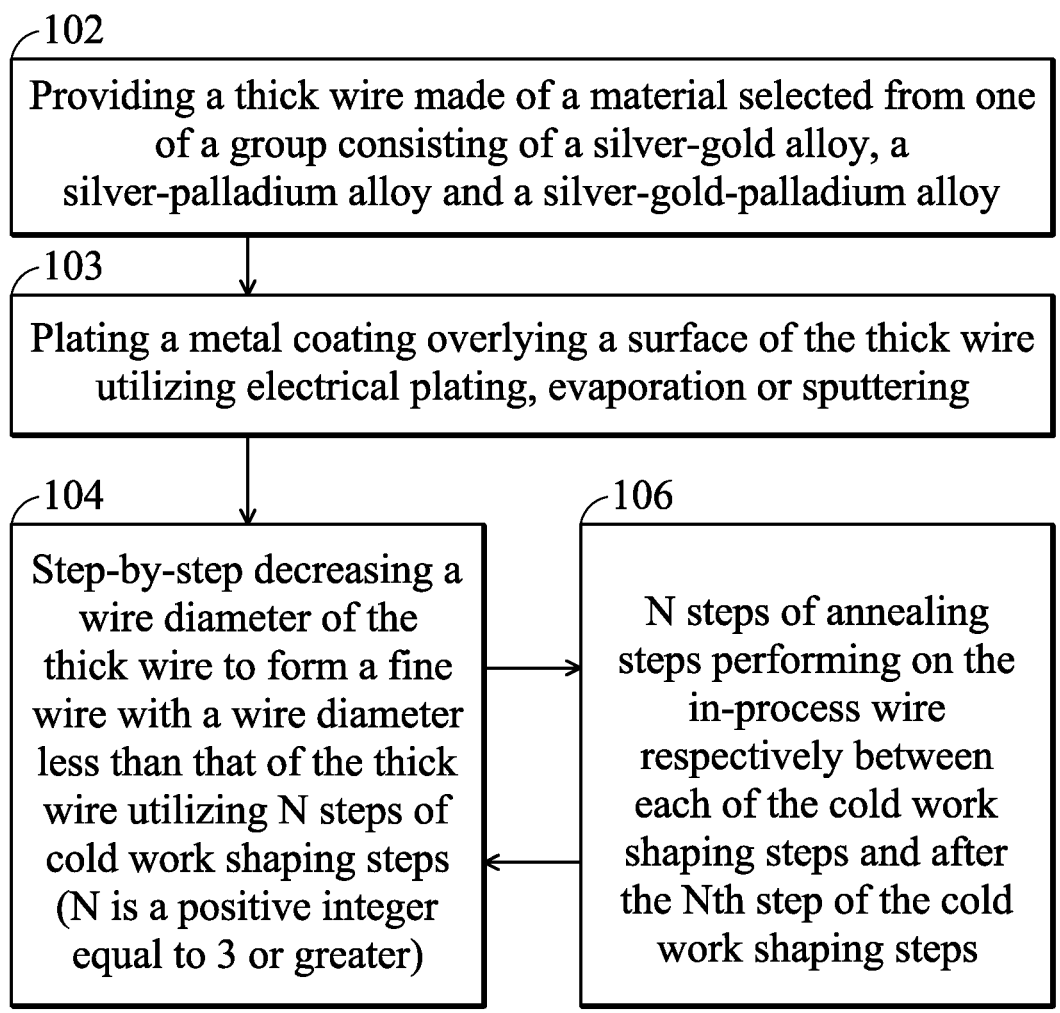
FIG. 4 is a flow chart showing an example of a manufacturing method of the alloy wire of the second embodiment of the invention.

Referring to the flow chart as shown in FIG. 4, an example of the manufacturing method of the alloy wire of the second embodiment of the invention may comprise steps 102, 103, 104 and 106, wherein the steps 102, 104 and 106 are the same as those described in the example of the manufacturing method of the alloy wire of the first embodiment of the invention. The step 103 is performed prior to the step 104 shown in FIG. 3. In the step 103, one or more layers of a metal coating is plated overlying a surface of the thick wire utilizing electrical plating, evaporation or sputtering. The metal coating is preferably made of a material selected from one of a group consisting of substantially pure gold, substantially pure palladium and a gold-palladium alloy. Further, the metal coating is preferably between 0.1 µm and 10 µm thick. As a result, the fabrication of the alloy wire of the second embodiment of the invention is completed.

Figure 5:
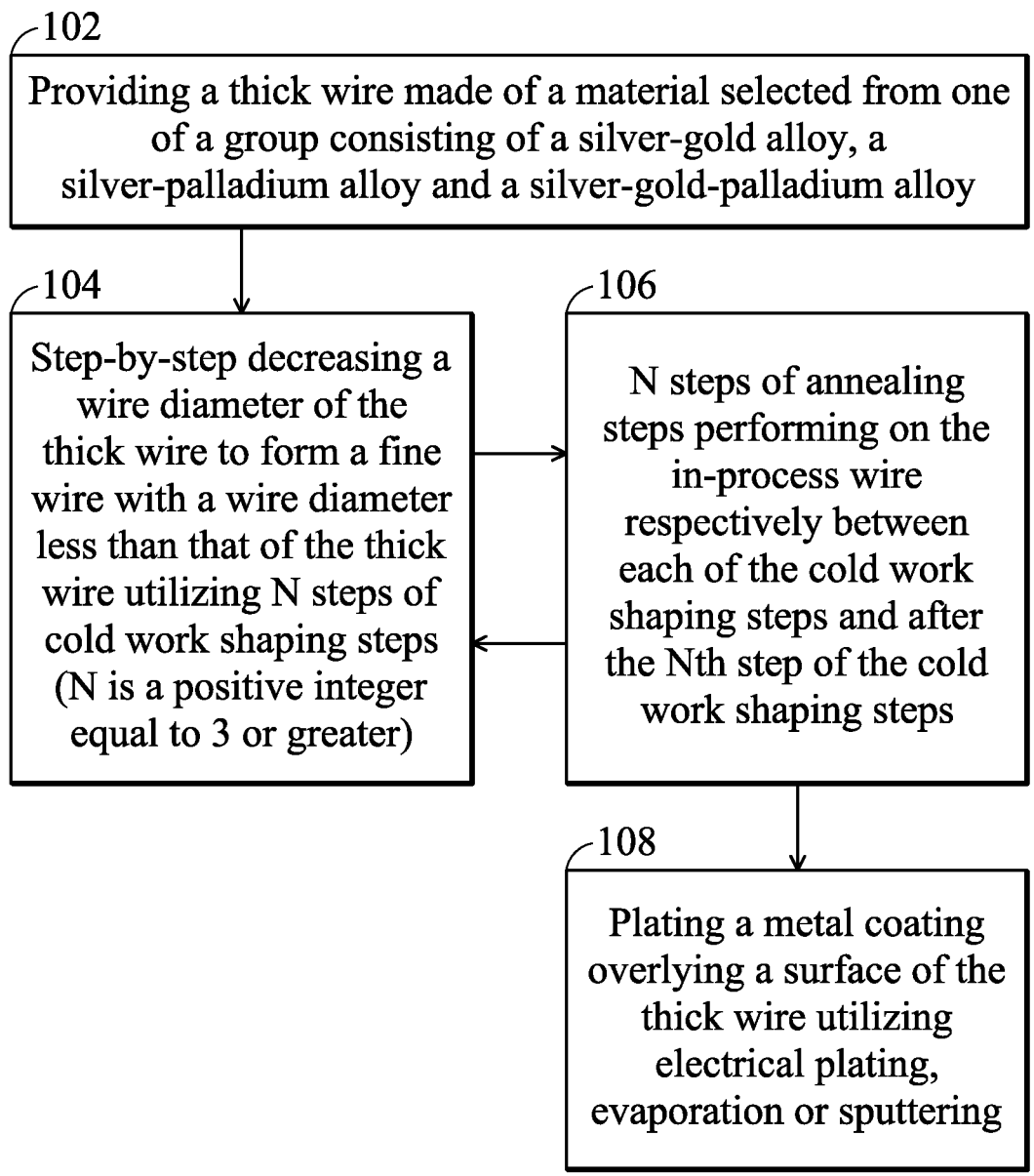
FIG. 5 is a flow chart showing another example of a manufacturing method of the alloy wire of the second embodiment of the invention.

Referring to the flow chart as shown in FIG. 5, another example of the manufacturing method of the alloy wire of the second embodiment of the invention may comprise steps 102, 104, 106 and 108, wherein the steps 102, 104 and 106 are the same as those described in the example of the manufacturing method of the alloy wire of the first embodiment of the invention. The step 108 is performed after the step 106 shown in FIG. 3. In the step 108, one or more layers of a metal coating is plated overlying a surface of the thick wire utilizing electrical plating, evaporation or sputtering. The metal coating is preferably made of a material selected from one of a group consisting of substantially pure gold, substantially pure palladium and a gold-palladium alloy. Further, the metal coating is preferably between 0.1 µm and 5 µm thick. As a result of performance of the example of the manufacturing method of the alloy wire of the second embodiment of the invention, the alloy wire of the second embodiment of the invention is completed.

In every described method, the cold work shaping steps in the step 104 are preferably wire drawing steps, extrusion steps or a combination thereof.

Figure 6:
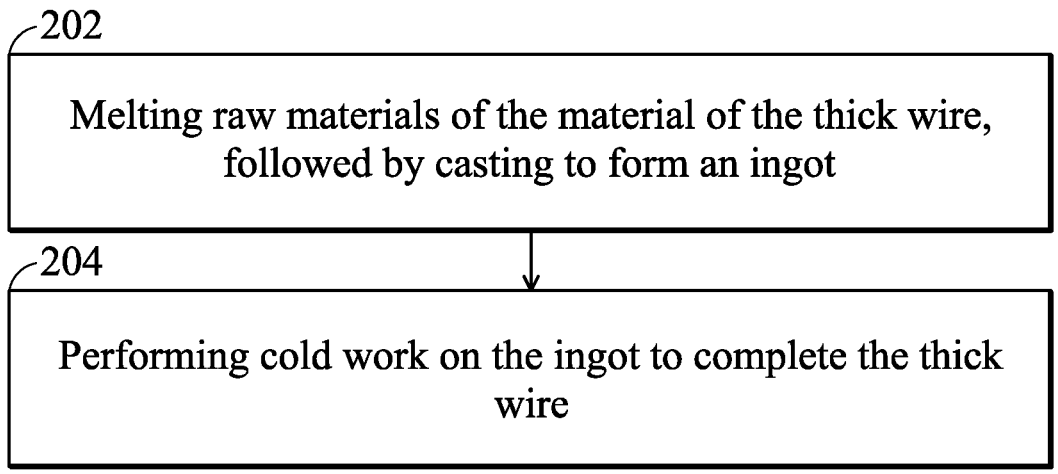
FIG. 6 is a flow chart showing an example of provision of the thick wire in the flowing charts shown in FIGS. 3-5.

In every described method, an example of a method of provision of the thick wire preferable comprises the subsequent cast step 202 and cold work step 204 with reference to the flow chart shown in FIG. 6.

In the cast step 202, raw materials of the material of the thick wire are heated and melted, followed by casting to form an ingot.

In the cold work step 204, the step performs cold work on the ingot to complete the thick wire. Similarly, the cold work step 204 can also be a wire drawing step, an extrusion step or a combination thereof.

Figure 7:
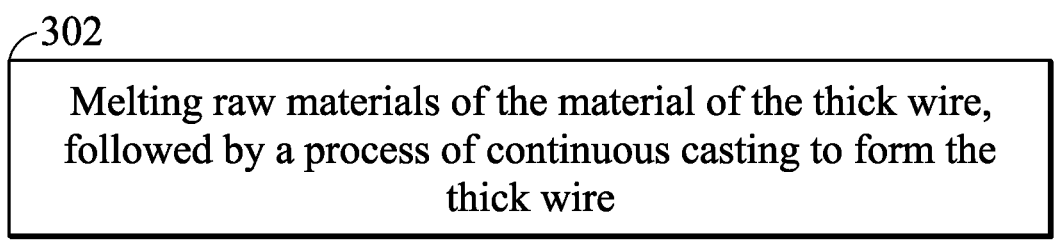
FIG. 7 schematically shows another example of provision of the thick wire in the flowing charts shown in FIGS. 3-5.

In every described method, another example of a method of provision of the thick wire preferable comprises the subsequent continuous casting step 302 a with reference to the schematic drawing shown in FIG. 7.

In the continuous casting step 302, raw materials of the material of the thick wire are heated and melted, followed by a process of continuous casting to form the thick wire.

In the described methods, it is preferred that the silver-gold alloy comprises 0.01 to 30.00 weight percent of gold and a balance of silver, the silver-palladium alloy comprises 0.01 to 10.00 weight percent of palladium and a balance of silver, and the silver-gold-palladium alloy comprises 0.01 to 30.00 weight percent of gold, 0.01 to 10.00 weight percent of palladium and a balance of silver.

In addition to the conditions of the described manufacturing methods, if a wire matching the alloy wire of the invention described in the specification is manufactured by other methods such as different cold work methods, different cold work deformation, different annealing conditions and etc., the wire is also comprised in the scope of the invention.

The inventors studied hard for a long period of time and discovered suitable cold work deformation conditions, collocating optimum annealing temperatures and annealing periods, completing a novel alloy wire comprising a lot of annealing twins therein. The novel alloy wire provides high electrical conductivity, high thermal conductivity, excellent antioxidative activity and excellent corrosion resistance. It is the most interesting that the twin boundaries can effectively suppress the electron migration. The twin boundaries provide anchor effect for the high angle grain boundaries around the grains, and thus, it is not easy to move the high angle grain boundaries. Therefore, grain growth is suppressed, and almost no heat affected zone is formed. On the other hand, annealing twins can also block the movement of dislocations because the crystal orientation of the annealing twins is different from the grain where the annealing twins are, and thus provide a strengthening effect for the material. Therefore, the tensile strength of the alloy wire of the invention is similar to or higher than that of the conventional metal wires, but the ductility of the alloy wire of the invention is higher than that of the conventional wires. These advantages provide excellent results in a reliability test for packaged semiconductor devices and packaged light emitting diodes with wire bonding utilizing the alloy wire comprising a lot of annealing twins. For example, the electronic product utilizing the alloy wire of the invention can endure for more than 128 hours conditions of Ta=121° C., 100% RH and 2 atm in the most rigid pressure cooker test (PCT), and the period of 128 hours is much higher than the period of 96 hours needed by the reliability test for common electronic products. The electronic product utilizing the alloy wire of the invention can endure for more than 128 hours conditions of Ta=148° C., 90% RH and bias of 3.6 volts in extremely rigid highly accelerated stress test (HAST), and the period of 528 hours is much higher than the period of 96 hours needed by the reliability test for common electronic products.

Example 1

A silver-8 wt % gold-3 wt % palladium alloy is smelted by high frequency electric smelting, followed by continuous casting to form a thick wire with a wire diameter of 6 mm. The thick wire becomes a fine wire with a wire diameter of 22.6 µm after a plurality of steps of wire drawing elongation and annealing treatment, followed by performance of the second-last step of wire drawing elongation, becoming a fine wire with a wire diameter of 20 µm. Next, the fine wire is annealed at 530° C. for 1.5 seconds, followed by performance of the last step of wire drawing elongation, becoming a fine wire with a wire diameter of 17.5 µm. Finally, the last step of the annealing treatment is performed on the fine wire at an annealing temperature of 570° C. for 4.8 seconds. Completing the last step of the annealing treatment, the fine wire is wound, and then an alloy wire product for wire bonding is complete.

In order to verify that plenty of annealing twin structures contribute to the excellent performance of the novel alloy wire of the invention, the same alloy of silver-8 wt % gold-3 wt % palladium alloy is utilized to form a fine wire with a wire diameter of 17.5 µm utilizing conventional wire drawing and annealing conditions, being a control group relative to the alloy wire with plenty of annealing twin structures of the invention. The alloy wire of the control group is not expected to have plenty of annealing twin structures therein. Moreover, the properties of the alloy wire are also compared to those of a commercial 4N pure gold wire and a copper wire with a palladium coating.

Figure 8A:
FIG. 8A shows a photograph of a Metallography structure along a lengthwise cross-section of the inventive alloy wire of the example 1.

As shown in FIG. 8A, a photograph of a Metallography structure along a lengthwise cross-section of the inventive alloy wire of the example 1 showed that there were some slender grains existing in the central part of the inventive alloy wire, and other parts of the inventive alloy wire consisted of equi-axial grains, wherein a quantity of the grains comprising annealing twins was more than 30 percent of the total quantity of the grains of the inventive alloy wire.

Figure 8B:
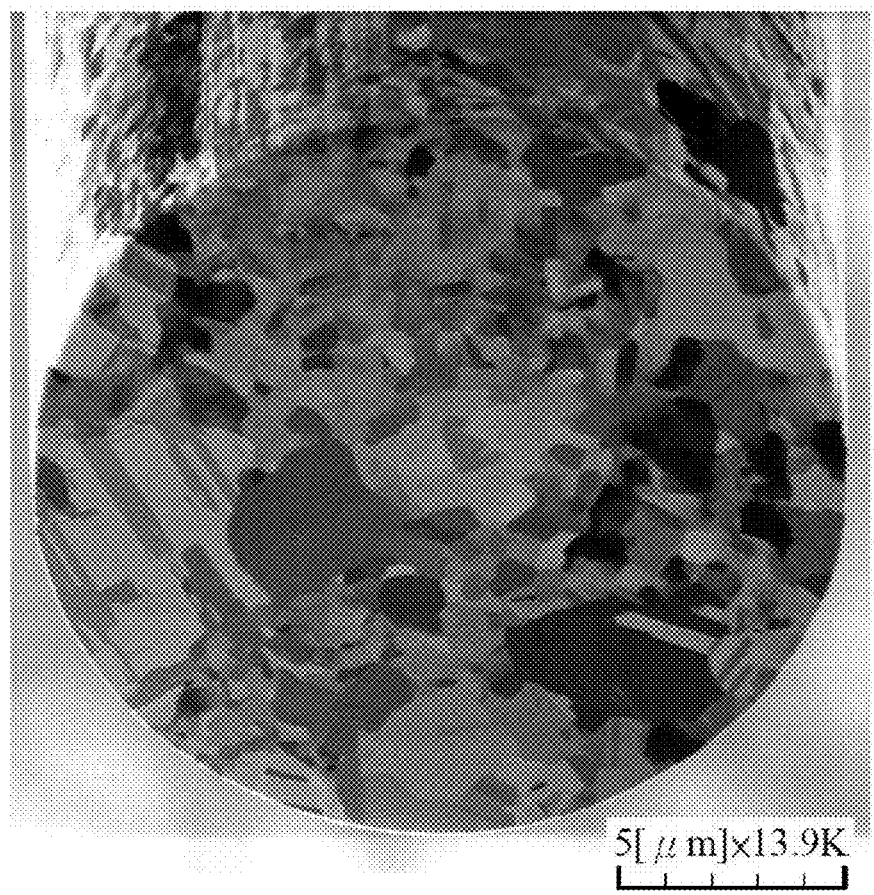
FIG. 8B shows a photograph of a Metallography structure along a transverse cross-section of the inventive alloy wire of the example 1.

As shown in FIG. 8B, a photograph of a Metallography structure along a transverse cross-section of the inventive alloy wire of the example 1 showed a quantity of the grains comprising annealing twins was more than 40 percent of the total quantity of the grains of the inventive alloy wire as calculated.

Figure 9A:
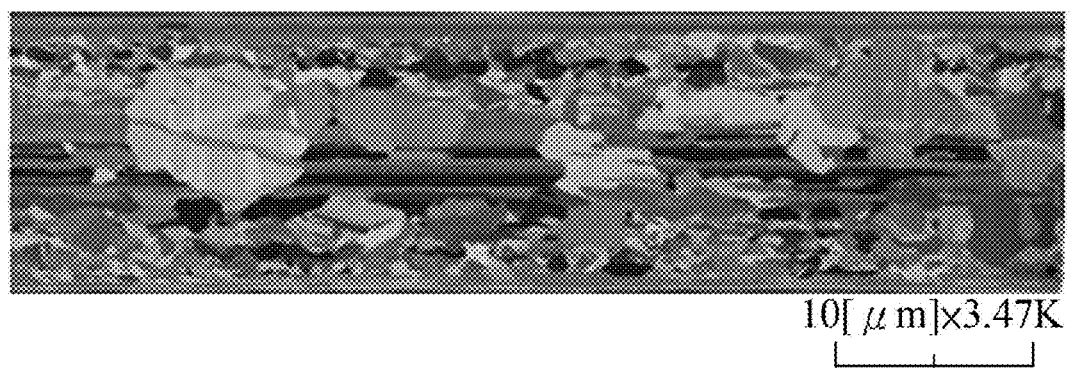
FIG. 9A shows a photograph of a Metallography structure along a lengthwise cross-section of the conventional alloy wire of the control group.

As shown in FIG. 9A, a photograph of a Metallography structure along a lengthwise cross-section of the conventional alloy wire of the control group showed that there were some slender grains mixed with a few coarse grains existing in the central part of the conventional alloy wire, and other parts of the conventional alloy wire consist of fine grain structures, wherein a quantity of the grains comprising annealing twins was only less than 10 percent of the total quantity of the grains of the conventional alloy wire.

Figure 9B:
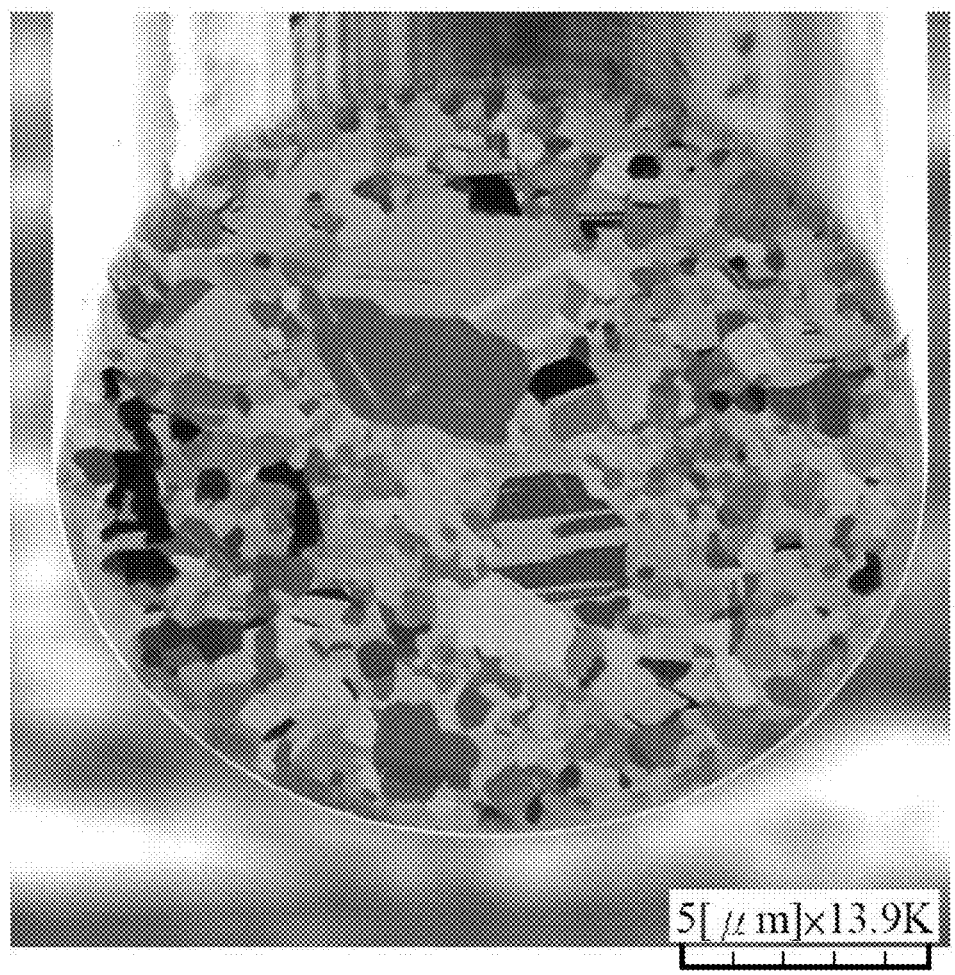
FIG. 9B shows a photograph of a Metallography structure along a transverse cross-section of the conventional alloy wire of the control group.

As shown in FIG. 9B, a photograph of a Metallography structure along a transverse cross-section of the conventional alloy wire of the control group showing fine grain structures showed that a quantity of the grains comprising annealing twins was only 15 percent of the total quantity of the grains of the conventional alloy wire as calculated.

Figure 10A:
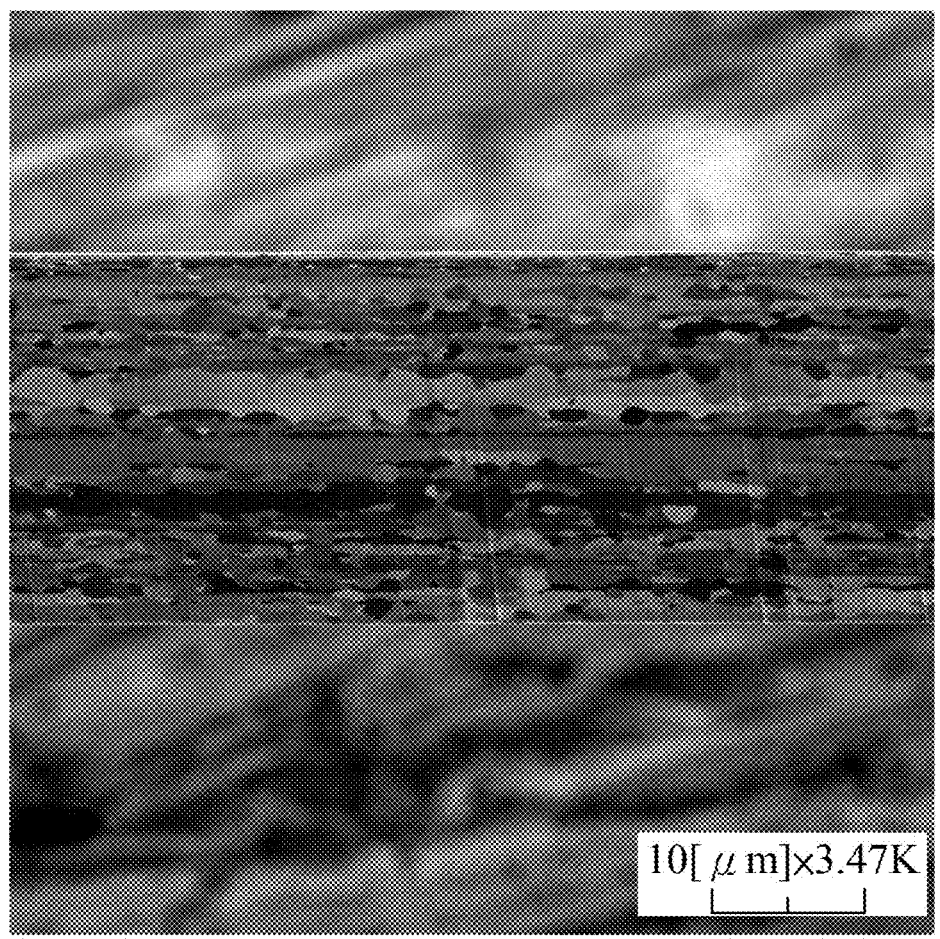
FIG. 10A shows a photograph of the Metallography structure along a lengthwise cross-section of the commercial 4N pure gold wire.
Figure 11A:
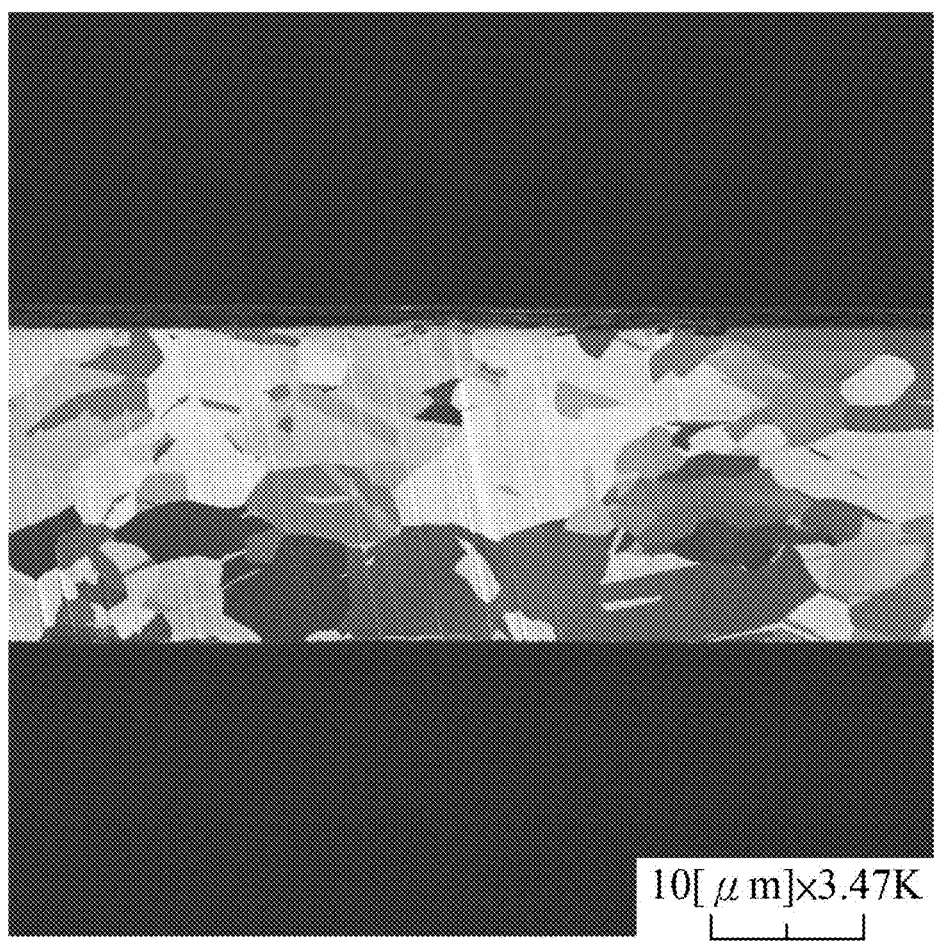
FIG. 11A shows a photograph of the Metallography structure along a lengthwise cross-section of copper wire with a palladium coating.

Similarly, only a few grains had annealing twin structures as shown in the photographs of the Metallography structure along lengthwise cross-sections of the commercial 4N pure gold wire (as shown in FIG. 10A) and the copper wire with a palladium coating (as shown in FIG. 11A).

In fact, no publication has ever disclosed the plenty of annealing twin structures of the characteristics of the invention to be found in conventional metal wires for wire bonding (referring to George G. Harman, Reliability and Yield Problems of Wire Bonding in Microelectronics, National Institute of Standards and Technology, 1991 by International Society for Hybrid Microelectronics.).

Figure 12A:
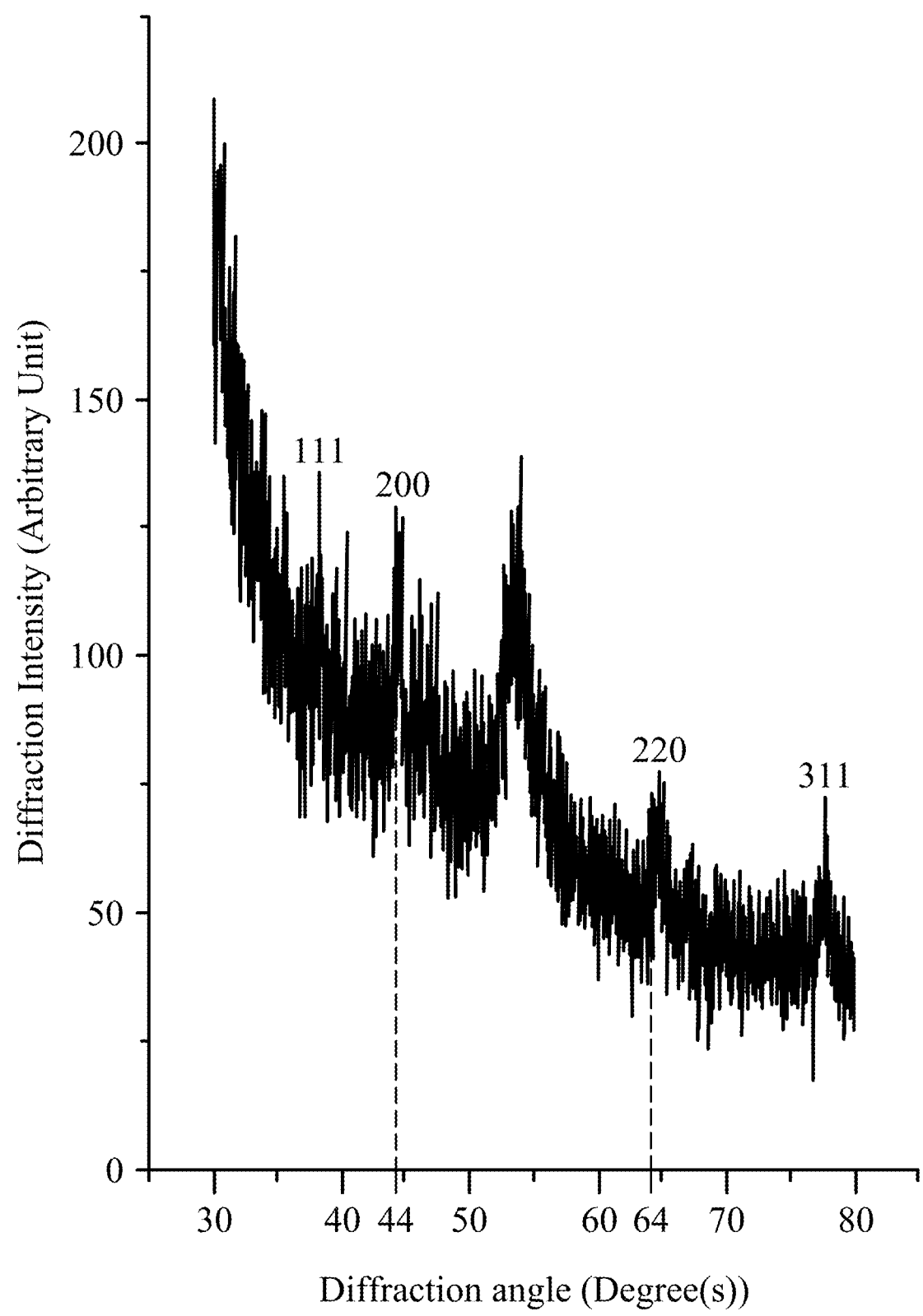
Figure 12B:
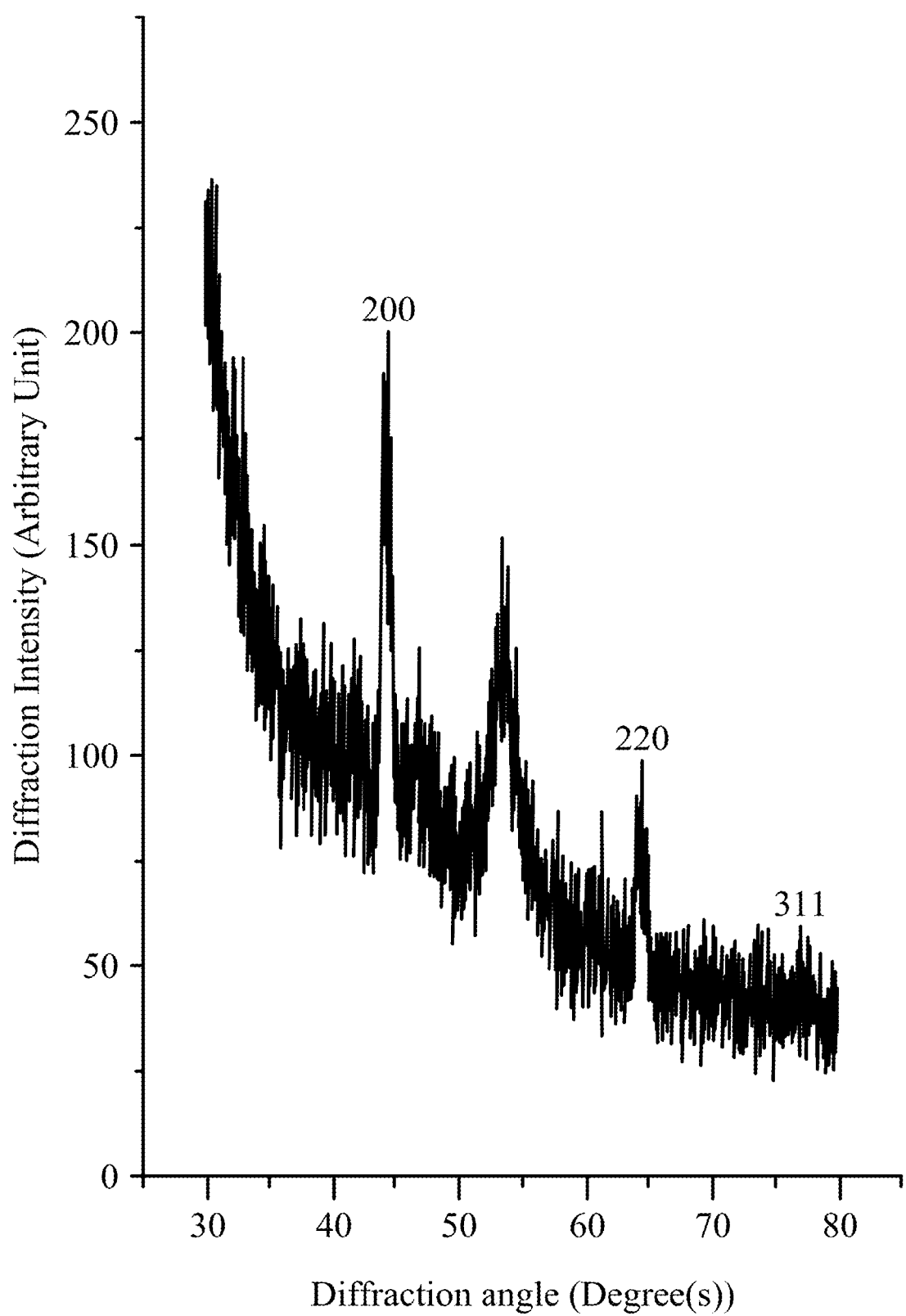

FIGS. 12A and 12B are X-ray diffraction charts, wherein FIG. 12A shows the X-ray diffraction chart of the alloy wire of the example 1 of the invention, and FIG. 12B shows the X-ray diffraction chart of a conventional wire. In FIGS. 12A and 12B, X-axis indicates the diffraction angle, and Y-axis indicates the diffraction intensity, wherein the unit of the diffraction angle is "degree(s)" (°), and the unit of the diffraction intensity is commonly "Arbitrary Unit" marked in common X-ray diffraction charts.

Further, as compared to the analysis results shown in FIGS. 12A and 12B, the chart of the alloy wire of the example 1 of the invention showed an apparent spectrum line of {111} crystal orientation. The {111} spectrum line is a typical crystal orientation spectrum line of annealing twins. There was no apparent {111} spectrum line in the X-ray diffraction chart of the conventional alloy wire of the control group. There was also no apparent {111} spectrum line found in the X-ray diffraction chart of the samples of the commercial 4N pure gold wire and the copper wire with a palladium coating. As a result, it was confirmed that there were plenty of annealing twin structures in the material of the alloy wire of the example 1 of the invention.

In order to verify the excellent performances provided by the alloy wire having plenty of annealing twin structures of the invention to give a full display of the improved performances of the invention, first, a tensile test was performed. The test results showed that the tensile strengths of the alloy wire had plenty of annealing twin structures of the invention and the alloy wire of the control group were approximately 7.5 g, which are similar to the tensile strengths (between 6.6 g and 10.7 g) of the commercial 4N pure gold wire and the copper wire with a palladium coating. However, the elongation of the alloy wire having few annealing twin structures of the control group was only 2.5%. The elongation of the alloy wire having plenty of annealing twin structures of the invention can be 4.5%, which is near the elongations (between 4.0% and 6.0%) of the commercial 4N pure gold wire and the copper wire with a palladium coating.

Then, an electrical property test was performed. The test results showed an average value of the electrical resistivity of the alloy wire having plenty of annealing twin structures of the example 1 of the invention to be approximately 5.0 $\mu\Omega\cdot cm$, wherein the minimum value therein was 4.1 $\mu\Omega\cdot cm$, which was less than 5.5 $\mu\Omega\cdot cm$ of an average value of the electrical resistivity of the alloy wire having few annealing twin structures of the control group. Further, the electrical resistivity of the alloy wire of the invention was slightly greater than those of the commercial 4N pure gold wire (2.3 $\mu\Omega\cdot cm$) and the copper wire with a palladium coating (1.9$\mu\Omega\cdot cm$).

In order to verify the high temperature stability of the alloy wire having plenty of annealing twin structures of the example 1 of the invention, all kinds of the described wires were put in a furnace with air atmosphere performing a heat treatment at 600° C. for 30 minutes.

Figure 8C:
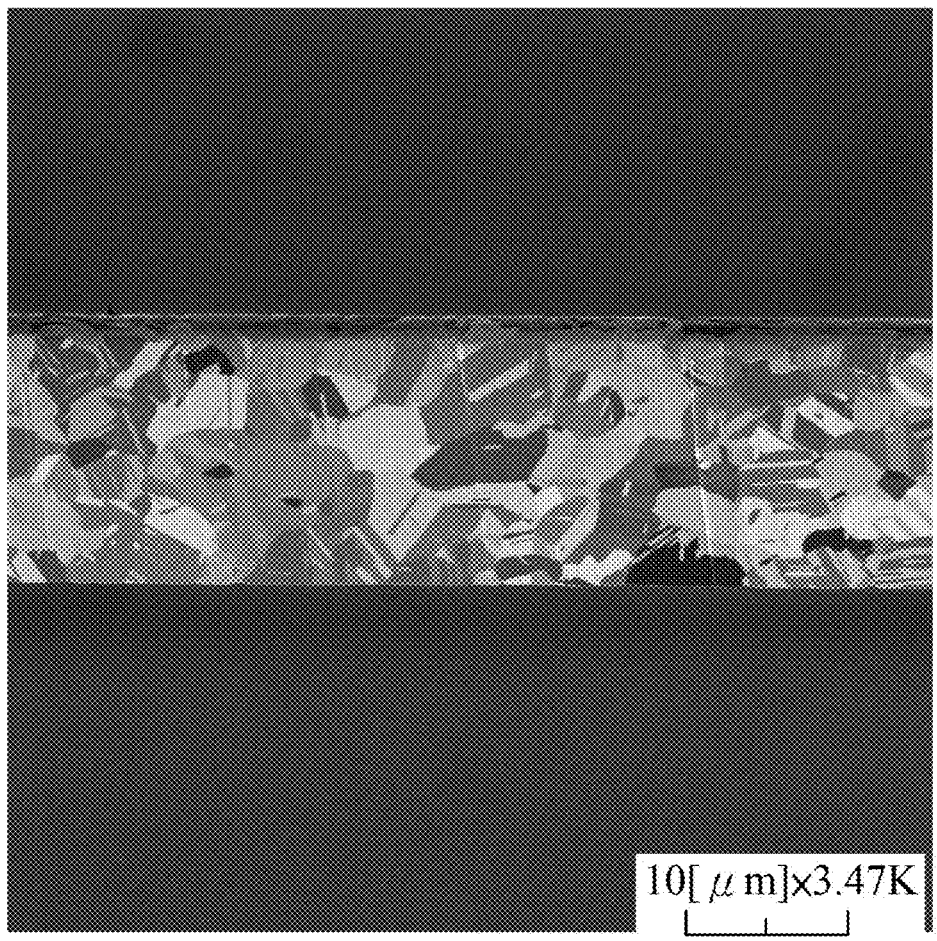
FIG. 8C shows a photograph of a Metallography structure along a lengthwise cross-section of the inventive alloy wire of the example 1 after performing a heat treatment at 600° C. for 30 minutes in a furnace with air atmosphere.

As shown in FIG. 8C, a photograph of a Metallography structure of the alloy wire having plenty of annealing twin structures of the example 1 of the invention showed the grain size to only slightly increase after the heat treatment.

Figure 9C:
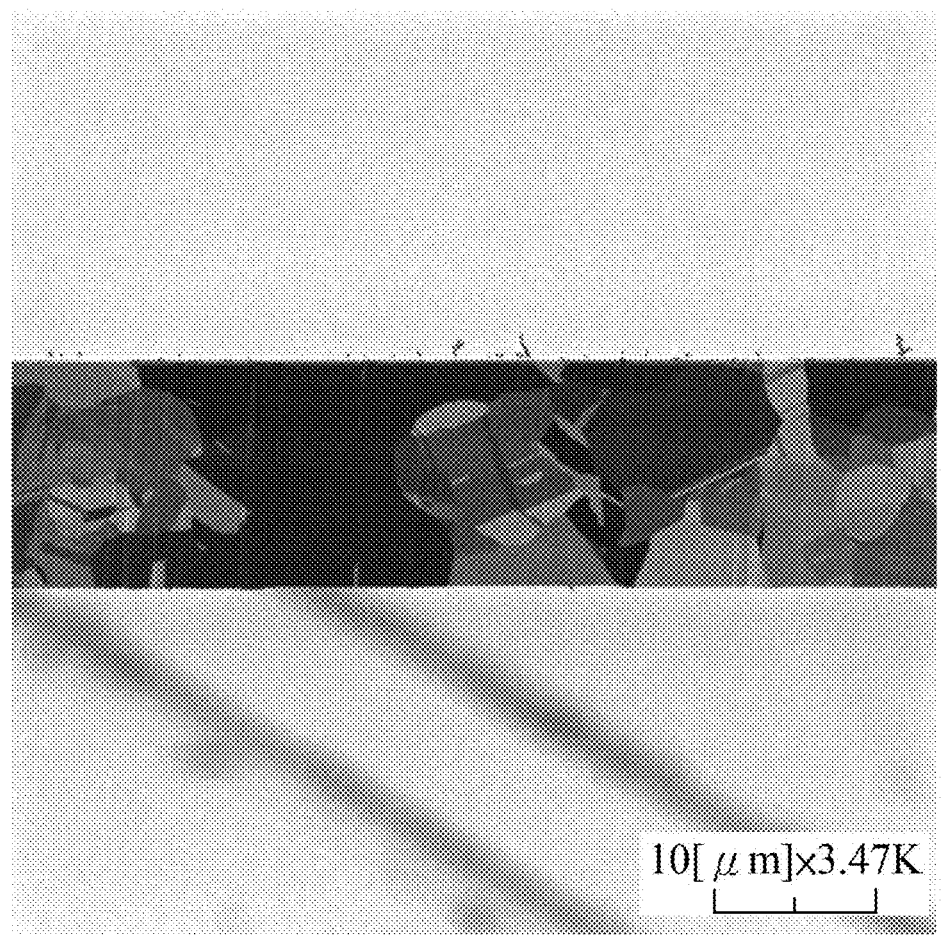
FIG. 9C shows a photograph of a Metallography structure along a lengthwise cross-section of the conventional alloy wire of the control group after performing a heat treatment at 600° C. for 30 minutes in a furnace with air atmosphere.

As shown in FIG. 9C, a photograph of a Metallography structure of the conventional alloy wire of the control group showed the grain size to abruptly increase as compared to the original fine grains, and the increased grain size was greater than that of the alloy wire of the example 1 of the invention after the heat treatment.

Figure 10B:
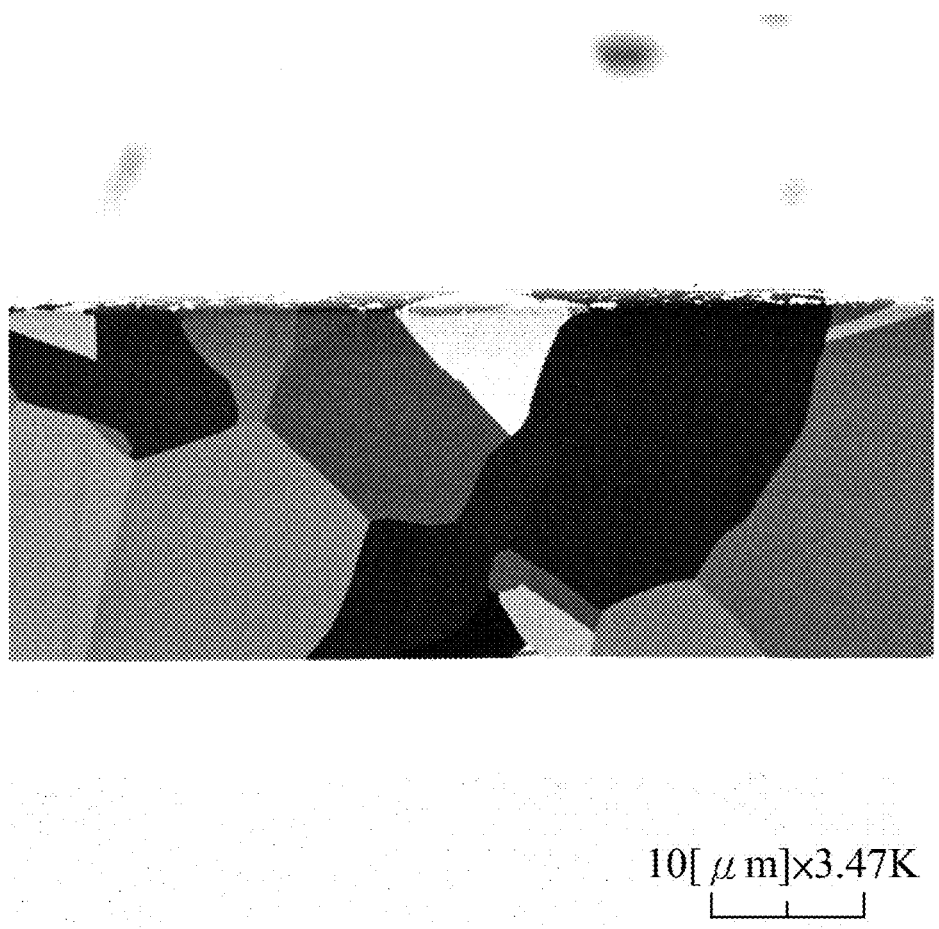
FIG. 10B shows a photograph of the Metallography structure along a lengthwise cross-section of the commercial 4N pure gold wire after performing a heat treatment at 600° C. for 30 minutes in a furnace with air atmosphere.

Further, as shown in FIG. 10B, a photograph of a Metallography structure of the commercial 4N pure gold wire showed abrupt grain growth after the heat treatment, wherein that the grain size was near the wire diameter.

Figure 11B:
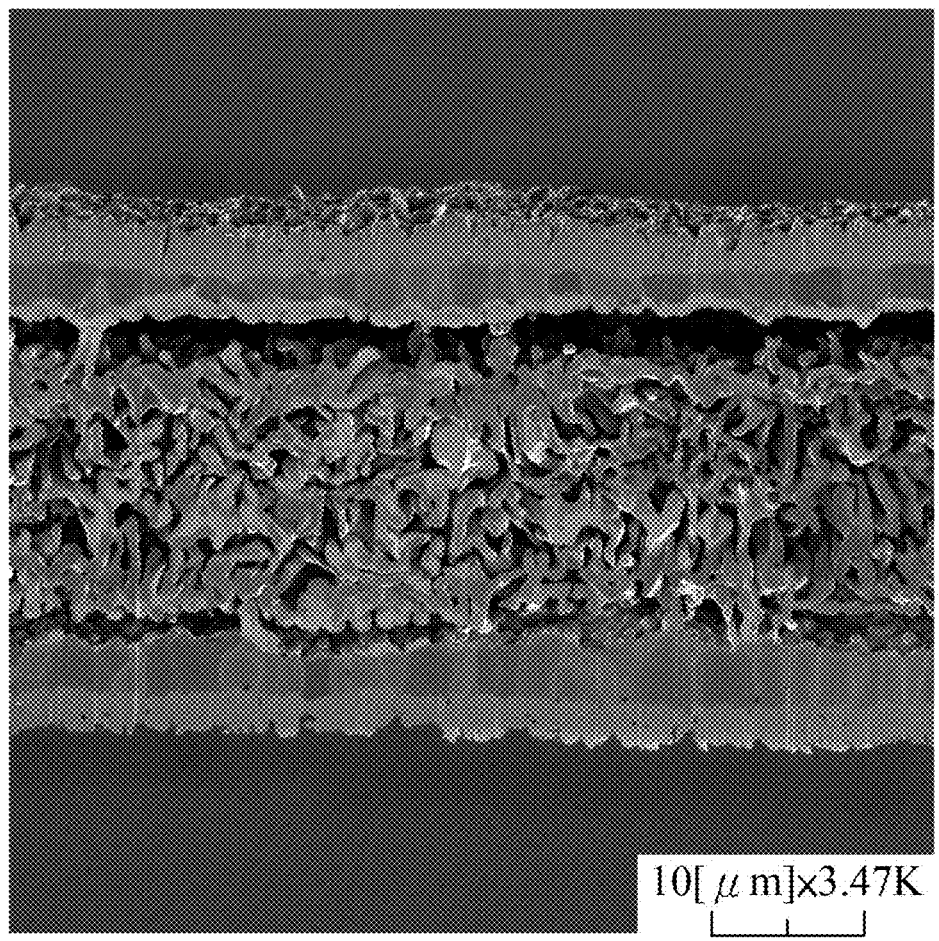
FIG. 11B shows a photograph of the Metallography structure along a lengthwise cross-section of copper wire with a palladium coating after performing a heat treatment at 600° C. for 30 minutes in a furnace with air atmosphere.

As shown in FIG. 11B, a photograph of a Metallography structure of the copper wire with a palladium coating showed the copper wire with a palladium coating was almost completely oxidized after the heat treatment, showing that the addition of the palladium surface coating is not the best solution to solve the oxidization problem of copper lines.

To sum up the experiment, it was confirmed that the grain structure of the alloy wire of the example 1 of the invention can block the movement of the grain boundaries due to existence of plenty of low energy twins. Thus, as compared to the conventional alloy wire, the commercial 4N pure gold wire and the copper wire with a palladium coating, the alloy wire of the example 1 of the invention exhibits excellent high temperature stability relating to the formation of the heat affected zone in the alloy wire after wire bonding and excellent reliability test performance.

Free air balls (FAB) were made by a wire bonding apparatus utilizing the alloy wire having plenty of annealing twin structures of the example 1 of the invention and the alloy wire having few annealing twin structures of the control group.

Figure 14:
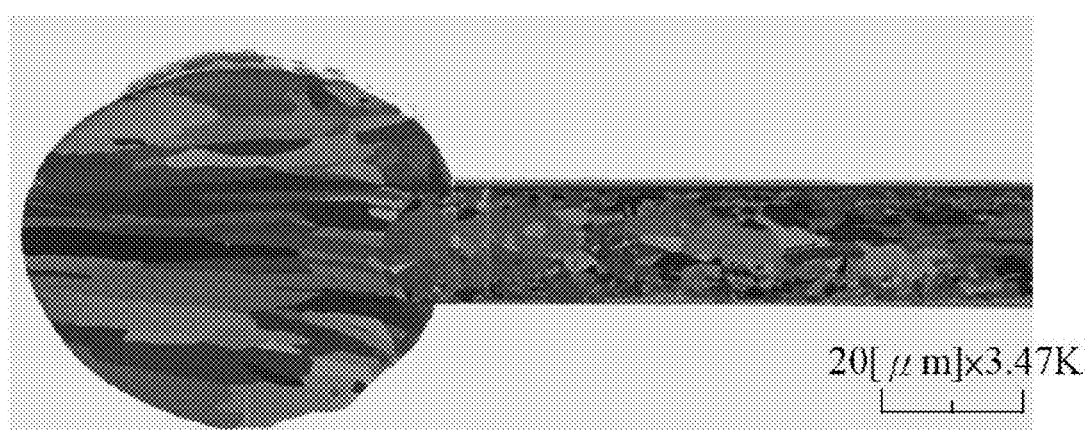
FIG. 14 shows a photograph of a cross-sectional Metallography structure of the free air ball of the alloy wire having few annealing twin structures of the control group.

As shown in FIG. 14, a photograph of a cross-sectional Metallography structure of the free air ball of the alloy wire having few annealing twin structures of the control group showed the heat affected zone to be 60 $\mu m$, and the grain size growing to more than 10 times that of the initial grain size in the heat affected zone.

Figure 13:
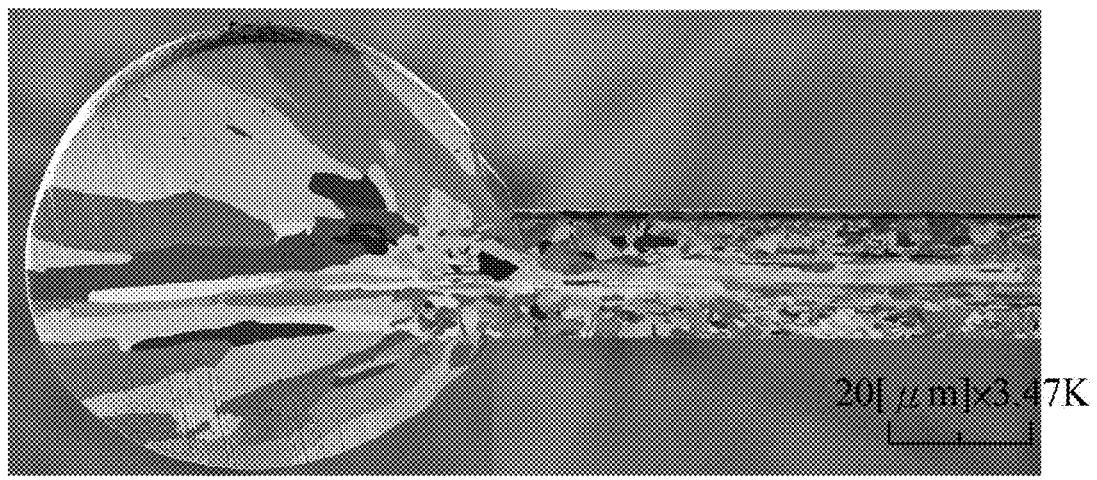
FIG. 13 shows a photograph of a cross-sectional Metallography structure of the free air ball of the alloy wire having plenty of annealing twin structures of the example 1 of the invention.

As shown in FIG. 13, a photograph of a cross-sectional Metallography structure of the free air ball of the alloy wire having plenty of annealing twin structures of the example 1 of the invention showed the heat affected zone to be only approximately 15 μm, and the grain size growing to less than 2 times that of the initial grain size in the heat affected zone.

As shown, the heat affected zone in the alloy wire having plenty of annealing twin structures of the example 1 of the invention was extremely small, and the grain growth almost did not deteriorate the strength of the contact of the ball.

Semiconductor devices completed by a process utilizing the alloy wire having plenty of annealing twin structures of the example 1 of the invention to perform wire bonding all passed a series of reliability tests. The results are shown in Table 1. The semiconductor devices endured for more than 128 hours conditions of the most rigid pressure cooker test (PCT), and the period of 128 hours is much higher than the period of 96 hours needed by the reliability test for common electronic products. The semiconductor devices endured for more than 128 hours conditions of in extremely rigid highly accelerated stress test (HAST), and the period of 128 hours is much higher than the period of 96 hours needed by the reliability test for common electronic products.

Table 1

TABLE 1

| TEST ITEM | TEST CONDITION | RESULT |
|---|---|---|
| 1. Precondition Test | baking (125 + 5 − 0° C., 24 hours) temperature and humidity test (30° C., 60% RH, 192 hours) Reflow: (260 + 0/−5° C., 3 times) | passed |
| 2. Pressure Cooker Test; PCT | Ta = 121° C., 100% RH , 2 atm 96 hours | passed |
| 3. Temperature Cycling Test; TCT | Ta = −65° C. ~ 150° C. (air-to-air thermal shock), 15 minutes/chamber 1000 cycles | passed |
| 4. Temperature&Humidity Test; THT | Ta = 85° C., 85% RH , no bias 1000 hours | passed |
| 5. High Temperature Storage Test; HTST | Ta = 150° C. 1000 hours | passed |
| 6. Low Temperature Storage Test; LTST | Ta = −40° C. 1000 hours | passed |
| 7. Solderability test | Steam aging: 93° C., 8 hours , Soldering dip: 245° C., 5 seconds | passed |
| 8. Highly Accelerated Stress Test; HAST | Ta = 148° C., 90% RH, bias of 3.6 voltage 96 hours | passed |
| 9. Thermal shock Test; TST | Ta = −65° C. ~ 150° C., 5 minutes/chamber 1000 cycles | passed |

Example 2

A silver-8 wt % gold-3 wt % palladium alloy is smelted by high frequency electric smelting, followed by continuous casting to form a thick wire with a wire diameter of 6 mm. The thick wire becomes a fine wire with a wire diameter of 22.6 μm after a plurality of steps of wire drawing elongation and annealing treatment, followed by performance of the second-last step of wire drawing elongation, becoming a fine wire with a wire diameter of 20 μm. Next, the fine wire is annealed at 650° C. for 10 seconds, followed by performance of the last step of wire drawing elongation, becoming a fine wire with a wire diameter of 17.5 μm. Finally, the last step of the annealing treatment is performed on the fine wire at an annealing temperature of 700° C. for 60 seconds. Completing the last step of the annealing treatment, the fine wire is wound, and then an alloy wire product for wire bonding is complete.

Figure 15A:
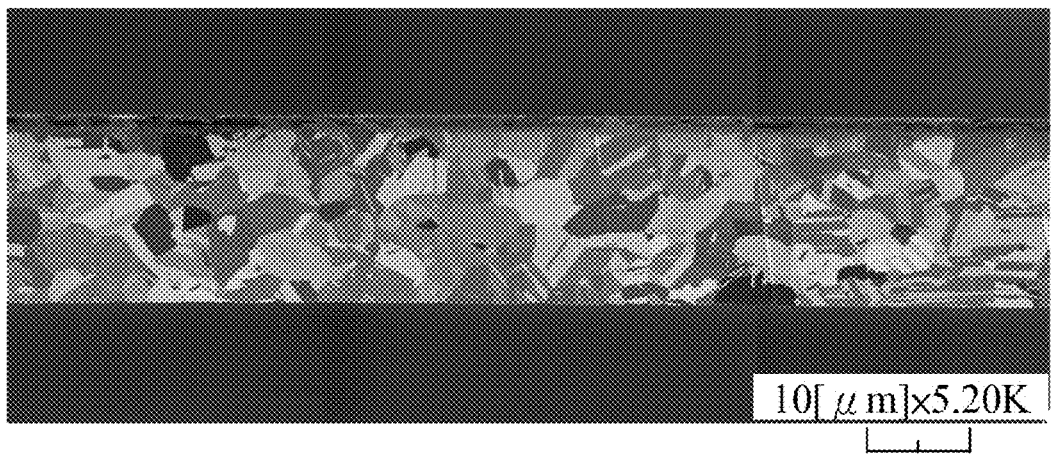
FIG. 15A shows a photograph of a Metallography structure along a lengthwise cross-section of the inventive alloy wire of the example 2.

As shown in FIG. 15A, a photograph of a Metallography structure along a lengthwise cross-section of the inventive alloy wire of the example 2 showed that the whole inventive alloy wire consists of equi-axial grains, wherein a quantity of the grains comprising annealing twins was more than 30 percent of the total quantity of the grains of the inventive alloy wire.

Figure 15B:
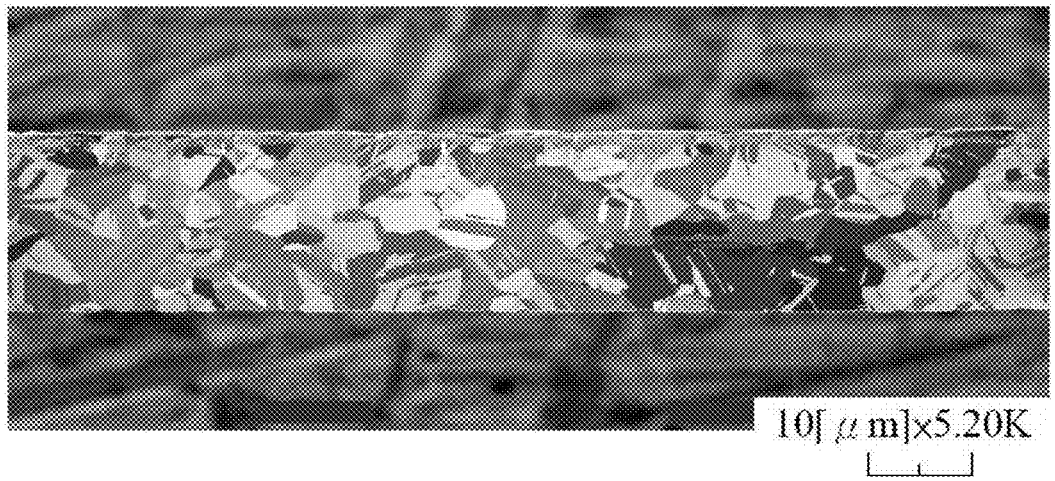
FIG. 15B shows a photograph of a Metallography structure along a lengthwise cross-section of the inventive alloy wire of the example 2 after performing a heat treatment in a furnace with air atmosphere at 600° C. for 30 minutes.

As shown in FIG. 15B, a photograph of a Metallography structure along a lengthwise cross-section of the inventive alloy wire of the example 2 after performing a heat treatment in a furnace with air atmosphere at 600° C. for 30 minutes showed the grain size is only slightly increased after the heat treatment.

While the invention has been described by way of example and in terms of preferred embodiment, it is to be understood that the invention is not limited thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. An alloy wire made of a material selected from one of a group consisting of a silver-gold alloy, a silver-palladium alloy and a silver-gold-palladium alloy, wherein
   the alloy wire is with a polycrystalline structure of a face-centered cubic lattice and comprises a plurality of grains;
   a central part of the alloy wire comprises slender grains or equi-axial grains, and the other parts of the alloy wire consist of equi-axial grains; and
   a quantity of the grains comprising annealing twins was 20 percent or more of the total quantity of the grains of the alloy wire.

2. The alloy wire as claimed in claim 1, wherein
   the silver-gold alloy comprises 0.01 to 30.00 weight percent of gold and a balance of silver;
   the silver-palladium alloy comprises 0.01 to 10.00 weight percent of palladium and a balance of silver; and
   the silver-gold-palladium alloy comprises 0.01 to 30.00 weight percent of gold, 0.01 to 10.00 weight percent of palladium and a balance of silver.

3. The alloy wire as claimed in claim 1, wherein a wire diameter of the alloy wire is between 10 μm and 50 μm.

4. The alloy wire as claimed in claim 2, wherein a wire diameter of the alloy wire is between 10 μm and 50 μm.

5. An alloy wire, comprising:
a base wire made of a material selected from one of a group consisting of a silver-gold alloy, a silver-palladium alloy and a silver-gold-palladium alloy, wherein the base wire is with a polycrystalline structure of a face-centered phase and comprises a plurality of grains, a central part of the base wire comprises slender grains or equi-axial grains, and the other parts of the base wire consist of equi-axial grains, and a quantity of the grains comprising annealing twins was 20 percent or more of the total quantity of the grains of the base wire; and
one or more layers of a metal coating plated overlying the base wire, wherein the metal coating is made of a material selected from one of a group consisting of substantially pure gold, substantially pure palladium and a gold-palladium alloy.

6. The alloy wire as claimed in claim 5, wherein
the silver-gold alloy comprises 0.01 to 30.00 weight percent of gold and a balance of silver;
the silver-palladium alloy comprises 0.01 to 10.00 weight percent of palladium and a balance of silver; and
the silver-gold-palladium alloy comprises 0.01 to 30.00 weight percent of gold, 0.01 to 10.00 weight percent of palladium and a balance of silver.

7. The alloy wire as claimed in claim 5, wherein a wire diameter of the alloy wire is between 10 μm and 50 μm.

8. The alloy wire as claimed in claim 6, wherein a wire diameter of the alloy wire is between 10 μm and 50 μm.

9. The alloy wire as claimed in claim 5, wherein the metal coating is between 0.1 μm and 5 μm thick.

10. A manufacturing method of an alloy wire, comprising:
providing a thick wire made of a material selected from one of a group consisting of a silver-gold alloy, a silver-palladium alloy and a silver-gold-palladium alloy;
step-by-step decreasing a wire diameter of the thick wire to form a fine wire with a wire diameter less than that of the thick wire utilizing N steps of cold work shaping steps, wherein in each of the (N−1)th and Nth steps of the cold work shaping steps, the deformation is between 1% and 15% compared to an in-process wire from its immediately preceding cold work shaping step, and wherein N is a positive integer equal to 3 or greater; and
N steps of annealing steps performed on the in-process wire respectively between each of the cold work shaping steps and after the Nth step of the cold work shaping steps, wherein
the (N−1)th step of the annealing steps between the (N−1)th and Nth steps of the cold work shaping steps is performed at an annealing temperature of between 0.5 Tm and 0.7 Tm during an annealing period of between 1 second and 10 seconds, wherein Tm is a melting point in the Kelvin temperature scale of the material of the thick wire; and
the Nth step of the annealing steps after the Nth step of the cold work shaping steps is performed at an annealing temperature of between 20K and 100K higher than that of the (N−1)th step of the annealing steps during an annealing period of between 2 seconds and 60 seconds, resulting in the fine wire being with a polycrystalline structure of a face-centered phase and comprising a plurality of grains, wherein a central part of the fine wire comprises slender grains or equi-axial grains, and the other parts of the fine wire consist of equi-axial grains, and forming annealing twins in at least some of the grains, wherein a quantity of the grains comprising the annealing twins is 20 percent or more of the total quantity of the grains of the fine wire.

11. The method as claimed in claim 10, wherein the cold work shaping steps are wire drawing steps, extrusion steps or a combination thereof.

12. The method as claimed in claim 10, wherein the provision of the thick wire comprises steps of:
melting raw materials of the material of the thick wire, followed by casting to form an ingot; and
performing cold work on the ingot to complete the thick wire.

13. The method as claimed in claim 10, wherein the provision of the thick wire comprises steps of melting raw materials of the material of the thick wire, followed by a process of continuous casting to form the thick wire.

14. The method as claimed in claim 10, further comprising plating a metal coating overlying a surface of the thick wire utilizing electrical plating, evaporation or sputtering prior to the cold work shaping steps, wherein the metal coating is made of a material selected from one of a group consisting of substantially pure gold, substantially pure palladium and a gold-palladium alloy.

15. The method as claimed in claim 10, further comprising plating a metal coating overlying a surface of the thick wire utilizing electrical plating, evaporation or sputtering after the Nth step of the cold work shaping steps, wherein the metal coating is made of a material selected from one of a group consisting of substantially pure gold, substantially pure palladium and a gold-palladium alloy.

16. The method as claimed in claim 10, wherein
the silver-gold alloy comprises 0.01 to 30.00 weight percent of gold and a balance of silver;
the silver-palladium alloy comprises 0.01 to 10.00 weight percent of palladium and a balance of silver; and
the silver-gold-palladium alloy comprises 0.01 to 30.00 weight percent of gold, 0.01 to 10.00 weight percent of palladium and a balance of silver.

17. The method as claimed in claim 10, wherein a wire diameter of the thick wire is between 5 mm and 10 mm, and a wire diameter of the fine wire is between 10 μm and 50 μm.

18. The method as claimed in claim 14, wherein the metal coating is between 0.1 μm and 10 μm thick.

19. The method as claimed in claim 15, wherein the metal coating is between 0.1 μm and 5 μm thick.

* * * * *